United States Patent
Suzuki et al.

(10) Patent No.: US 7,159,292 B2
(45) Date of Patent: *Jan. 9, 2007

(54) RECOVERY PROCESSING METHOD OF AN ELECTRODE

(75) Inventors: Takeyuki Suzuki, Yokohama (JP); Yoshinori Wakabayashi, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/010,669

(22) Filed: Dec. 14, 2004

(65) Prior Publication Data

US 2005/0102828 A1    May 19, 2005

Related U.S. Application Data

(63) Continuation-in-part of application No. 10/443,813, filed on May 23, 2003, now Pat. No. 6,905,952.

(30) Foreign Application Priority Data

| May 27, 2002 | (JP) | ............................ 2002-153062 |
| Jan. 9, 2003 | (JP) | ............................ 2003-003508 |
| Nov. 26, 2004 | (JP) | ............................ 2004-342991 |

(51) Int. Cl.
*B23P 6/00* (2006.01)

(52) U.S. Cl. .................. 29/402.01; 29/402.05; 29/592.1; 29/825; 29/874; 29/876; 438/612; 438/613

(58) Field of Classification Search .......... 29/402.01, 29/402.05, 592.1, 825, 874, 876; 438/612, 438/613
See application file for complete search history.

(56) References Cited

U.S. PATENT DOCUMENTS 6,905,952 B1 *  6/2005  Suzuki et al. ............... 438/612

FOREIGN PATENT DOCUMENTS

| CN | 90104620.5 | 1/1991 |
| EP | 0 415 896 A1 * | 3/1991 |
| EP | 0415896 A1 | 3/1991 |
| JP | 59-154035 | 9/1984 |
| JP | 04-252964 | 9/1992 |
| JP | 08-96865 | 4/1996 |
| JP | 10-115637 | 5/1998 |
| JP | 10-132852 | 5/1998 |
| JP | 11-064388 | 3/1999 |
| JP | 2000-294043 | 10/2000 |
| JP | 2001-004700 | 1/2001 |

OTHER PUBLICATIONS

Office Action from Chinese Patent Office in Patent Application No. 031384099, dated Oct. 29, 2004.
Office Notice of Rejection from Japanese Patent Office dated Aug. 26, 2005 in Japanese Patent Application No. 2003-003508.

* cited by examiner

*Primary Examiner*—Carl J. Arbes
(74) *Attorney, Agent, or Firm*—Finnegan, Henderson, Farabow, Garrett & Dunner LLP

(57) ABSTRACT

While a transfer surface 10a of a transfer plate 10 having a predetermined surface roughness is brought into contact with a plurality of bumps 44B on a contact sheet 44 formed on a substrate 44M having the coefficient of linear expansion larger than that of the transfer plate 10 at a predetermined pressure, the substrate 44M and the transfer plate 10 are heated to a predetermined temperature to recover the surface roughness of the bump 44B to a predetermined value.

3 Claims, 34 Drawing Sheets

RECOVERY PROCESSING METHOD OF AN ELECTRODE

This application is a continuation-in-part of U.S. application Ser. No. 10/443,813 filed May 23, 2003 now U.S. Pat. No. 6,905,952. Accordingly, this application claims priority benefit to U.S. application Ser. No. 10/443,813, and also claims priority benefit to Japanese Patent Application No. 2002-153062 filed May 27, 2002, and Japanese Patent Application No. 2003-003508 filed Jan. 9, 2003, and further, Japanese Patent Application No. 2004-342991 filed Nov. 26, 2004, and the contents of each of the aforementioned U.S. application and Japanese Applications are incorporated hereinto by reference.

BACKGROUND OF THE INVENTION

1. Field of the Invention

The present invention relates to a recovery processing method of an electrode for recovering a connection surface of an electrode region in an electrode plate for electrically connecting the same to terminals of a semiconductor device, to have a predetermined surface roughness.

2. Description of the Related Art

Generally, in an IC socket or a connector for an electronic equipment, it is desired that terminals of a semiconductor device mounted are assuredly connected to electrodes of a wiring circuit board in the electrical sense. In such a device, as disclosed in Japanese Patent Application Laid-open Nos. 8-96865 (1996) and 2000-294043, it is proposed that a sufficiency of a ceramic sprayed coating by spraying, or micro-projections formed by spraying, an etching treatment sufficient for breaking an oxide film formed on a terminal of a semiconductor device is formed on an electric contact section of a conductive pattern or an end face of a conductive path to be connected to the terminal (electrode) of the semiconductor device. By forming the micro-projections on the electric contact section or the end face of the conductive path in such manner, a mutual contact area is reduced and a contact pressure per unit area increases. Thus, the micro-projections have an effect of easily breaking the oxide film.

As a result, the terminal of the semiconductor device is assuredly connected to the electrode of the wiring circuit board in the electrical sense.

In the above-mentioned IC socket for the electronic equipment, when the electric contact section in the conductive pattern has been repeatedly used, the micro-pattern or the ceramic sprayed coating having wear resistance is also worn due to the contact pressure or the like because a life of the durability has a certain limitations. Accordingly, the electric contact section or the end surface of the conductive path becomes gradually non-irregularity flat surface rather than recovery as the frequency of use increases, which may increases the contact area to result in an insufficient contact pressure. Thus, there may be a case in that the original reliable electric connection is not obtainable as repeating the use thereof.

SUMMARY OF THE INVENTION

In view of the above problems, the present invention has been made to provide a recovery processing method of an electrode for recovering a connection surface of an electrode section in an electrode plate to be electrically connected to a terminal of a semiconductor device so that the connection surface is recovered to have a predetermined surface roughness, which the method is capable of easily and reliably forming a predetermined irregularity on the connection surface of the electrode section in the worn electrode plate.

To achieve the above object, a recovery processing method of an electrode comprises a first step of placing a transfer plate having an irregular surface onto a connection surface of an electrode section formed on an insulation substrate of an electrode plate for the electric connection to a terminal section of a semiconductor device via the connection surface of the electrode section, so that the irregular surface of the transfer plate is brought into contact with the connection surface of the electrode section each other, wherein the transfer plate is formed of a material having the coefficient of linear expansion which is different from that of the insulation substrate of the electrode plate, a second step of heating the transfer plate and the electrode plate at a predetermined temperature for a predetermined period while pressing the transfer plate placed on the connection surface of the electrode section in the first step toward the connection surface of the electrode section at a predetermined pressure, and a third step of separating the transfer plate from the electrode plate to form a predetermined irregularity on the connection surface of the electrode section.

The predetermined temperature and period in the second step may be set in the range from 80 to 150° C. and in the range from 5 to 15 minutes, respectively.

A recovery processing method of an electrode according to the present invention comprises a first step of placing a terminal section of a semiconductor device on a connection surface of an electrode section of an electrode plate having the electrode section formed on an insulation substrate, for the electric connection to the terminal section of the semiconductor device via the connection surface of the electrode section, wherein the electrode section containing, in a base material, a predetermined amount of micro-crystalline materials having a wear resistance higher than that of the base material, and a second step of wearing the connection surface of the electrode plate while contacting the terminal section of the semiconductor with the connection surface of the electrode plate to expose part of the crystalline materials and forming a predetermined irregularity on the connection surface.

The crystalline materials may be formed of palladium or nickel having a hardness higher than that of a copper as the base material and a relatively high electric conductivity.

A recovery processing method of an electrode according to the present invention comprises a first step of placing a transfer plate having an irregular surface onto a connection surface of an electrode section formed on an insulation substrate of an electrode plate having the insulation substrate for the electric connection to a terminal section of a semiconductor device via the connection surface of the electrode section, so that the surface of the transfer plate is brought into contact with the connection surface of the electrode section each other, a second step of relatively moving the transfer plate or the connection surface of the electrode section at least once in either of directions generally parallel to the connection surface at a predetermined distance, while pressing the transfer plate placed on the connection surface of the electrode section in the first step toward the connection surface of the electrode section at a predetermined pressure, and a third step of separating the transfer plate from the electrode plate to form a predetermined irregularity on the connection surface of the electrode section.

In the second step, the electrode plate may be moved relative to the transfer plate by a sliding device for moving the electrode plate generally parallel to the connection surface of the electrode section while supporting the electrode plate thereby.

The pressure in the second step may be in the range from 1 to 100 g per one electrode, and the distance of the relative movement in the second step may be in the range from 1 μm to 1 mm.

The recovery processing method of an electrode according to the present invention may comprise a first step of placing a transfer plate having an irregular transfer surface of an arithmetic mean deviation of the profile Ra in a range from 0.5 to 1.5 μm or less onto a connection surface of an electrode section formed on an insulation substrate for the electric connection to a terminal section of a semiconductor device via the connection surface of the electrode section, so that the transfer surface of the transfer plate is brought into contact with the connection surface, a second step of pressing the transfer plate placed on the connection surface of the electrode section in the first step toward the connection surface of the electrode section at a predetermined distance, and a third step of separating the transfer plate from the electrode plate after the transfer plate has been pressed in the second step to form a predetermined irregularity on the connection surface of the electrode section.

As apparent from the above description, according to the recovery processing method of an electrode, since the transfer plate and the electrode plate are heated at the predetermined temperature for the predetermined period toward the connection surface of the electrode section while pressing the transfer plate placed on the connection surface of the electrode section toward the connection surface of the electrode section at the predetermined pressure, both the plates relatively slide to each other due to the difference in the expansion, it is possible to scrape the connection surface of the electrode to have the predetermined surface roughness and thus easily and assuredly form the predetermined irregularity on the worn connection surface of the electrode section in the electrode plate.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 7:
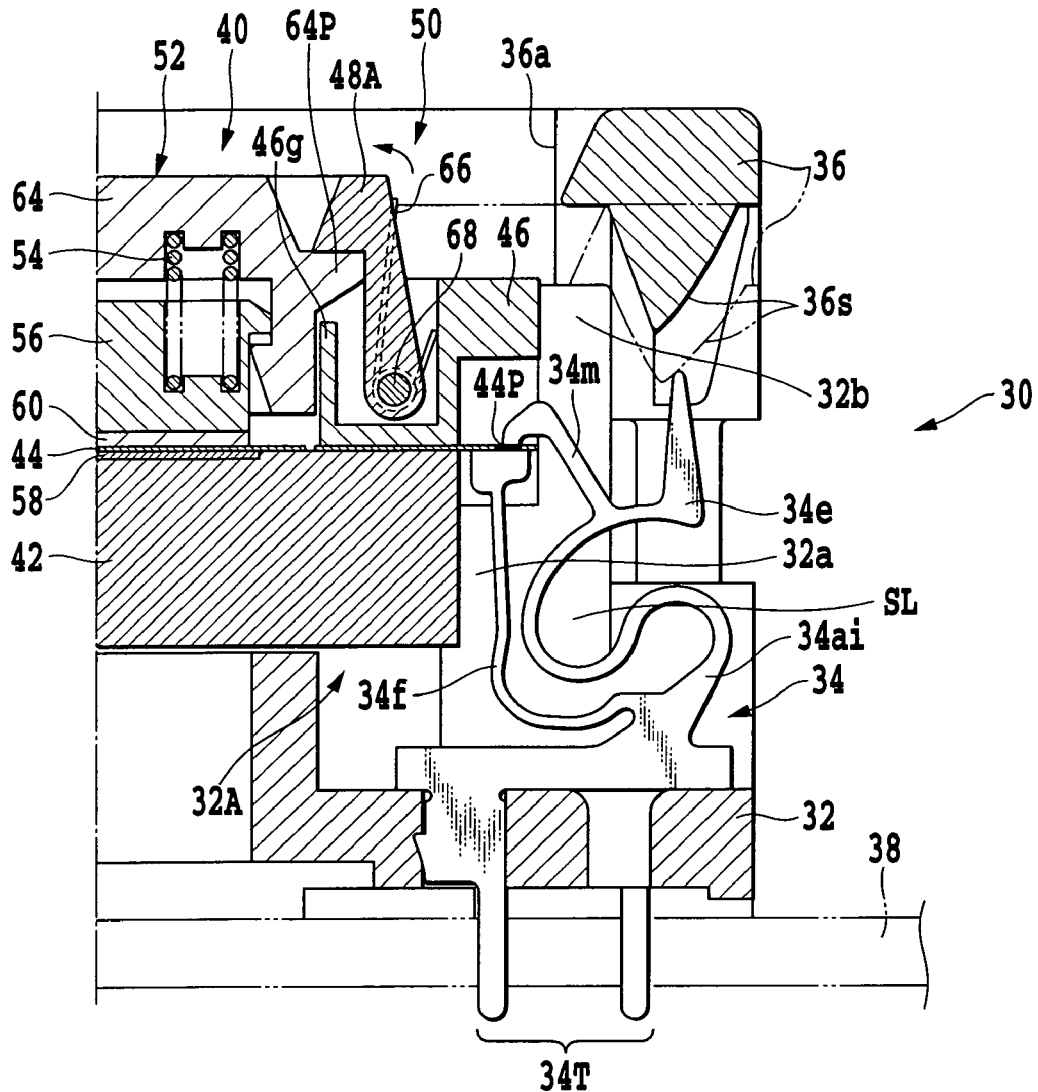
FIG. 7 is a partially sectional view showing an example of a socket for a semiconductor device provided with a contact sheet to which first and second embodiments of a recovery processing method of an electrode according to the present invention is applied.

FIG. 7 illustrates a socket for a semiconductor device provided with a connection electrode plate to which first, second and third embodiments of a recovery processing method of an electrode according to the present invention described below are applied.

In the socket for the semiconductor device shown in FIG. 7, a test for an electric characteristic of the semiconductor device, more specifically, a burn-in test is carried out. The socket for the semiconductor device includes a carrier unit 40 for accommodating a bare chip as a semiconductor device therein and an IC socket 30 for detachably mounting the carrier unit 40 therein.

The IC socket 30 is mainly constructed from a body section 32 having an accommodation portion for accommodating the carrier unit 40 therein, disposed on a printed wiring board 38 for inputting a test signal to the bare chip and outputting a tested output signal from the bare chip, a contact group 34 provided in the body section 32, consisting of a plurality of contacts to be electrically connected to the respective pads of a contact sheet as a connection electrode plate described later, which is an element of the carrier unit 40, and cover member 36 adapted to be movable upward and downward relative to the body section 32, for selectively electrically connecting the respective contact portions of the contact group 34 to the respective pads of the contact sheet.

The body section 32 molded into resinous material is disposed at a predetermined position in correspondence to the electrode section of the printed wiring board 38. As shown in FIG. 7, the body section 32 has an accommodation portion 32A for accommodating the carrier unit 40. The accommodation portion 32A is defined by the inner periphery of a lower base 32a engaged with a lower portion of the base section of the carrier unit 40 described later and the inner periphery of an upper base 32b contiguous to the lower base 32a and engaged with a upper portion of the base section. In the lower base 32a, the contact group 34 is supported. In the lower base 32a and the upper base 32b, slits SL for inserting and receiving the respective contacts 34ai (i=1 to n; n is a positive integer) comprising the contact group 34 are formed.

The contact 34ai (i=1 to n; n is a positive integer) made of metal sheet is constituted of a terminal portion 34T press-fit into the lower base 32a, a fixed contact section 34f contiguous to the terminal portion 34T and electrically connected to the pad of the contact sheet from a lower side, an elastic movable contact portion 34m contiguous to the terminal portion 34T and electrically connected to the pad of the contact sheet from an upper side, and an portion being engaged 34e selectively engageable with a slanted surface of the cover member 36 described later to move rotationally the movable contact portion 34m in the direction that moves away from the fixed contact portion 34f. The portion being engaged 34e is branched from a proximal end of the movable contact portion 34m and extends toward the cover member 36.

In FIG. 7, the respective contacts 34ai are arranged in the generally vertical direction to a paper surface at a given distance in correspondence to the respective pads of the contact sheet 44. Note that only one contact group 34 is shown in FIG. 7, in four contact groups 34 encircling four sides of the accommodation portion 32A.

The cover member 36 molded into resinous material has an opening 36a for allowing the carrier unit 40 to pass therethrough. A frame section forming a peripheral edge of the opening 36a is supported to be movable upward and downward by legs (not shown) guided by a groove (not shown) provided on the outer periphery of the body portion. Note that the cover member 36 is biased by an elastic member not shown to be away from the body section 32. At a lower end of the respective side of the frame section, a slanted surface portion 36s is formed, respectively, which is engaged with a tip end of the portion being engaged 34e of the respective contact 34ai when the cover member 36 is lowered to a predetermined position as shown by a chain double-dashed line in FIG. 7, and moves rotationally the movable contact portion 34m to be away from the fixed contact portion 34f against the elastic force thereof.

When the carrier unit 40 described later is mounted to the accommodation portion 32A of the body section 32 of the IC socket 30, the respective movable contact portion 34m in the contact group 34 moves backwards relative to the accommodation portion 32A to be on standby by pushing down the cover member 36 at a predetermined distance and is maintained in a waiting state. Thereafter, the carrier unit 40 is put into the accommodation portion 32A from above through the opening 36a and placed at a predetermined position. At that time, the fixed contact portion 34f is brought into contact with the lower surface of the pad of the contact sheet 44 in the carrier unit 40.

Next, when the cover member 36 is released from the maintained state, the cover member 36 is subjected to move upward by the resultant force of the recovery force of the above-mentioned elastic body and the elastic force of the portion being engaged 34e of the respective contact 34ai. At that time, the respective movable contact portion 34m of the contact group 34 returns from the above-mentioned waiting position to the original position, and is brought into contact with the upper surface of the pad of the contact sheet 44 in the carrier unit 40. Thereby, as shown in FIG. 7, the respective pads of the contact sheet 44 are electrically connected to the contact group 34.

Figure 8:
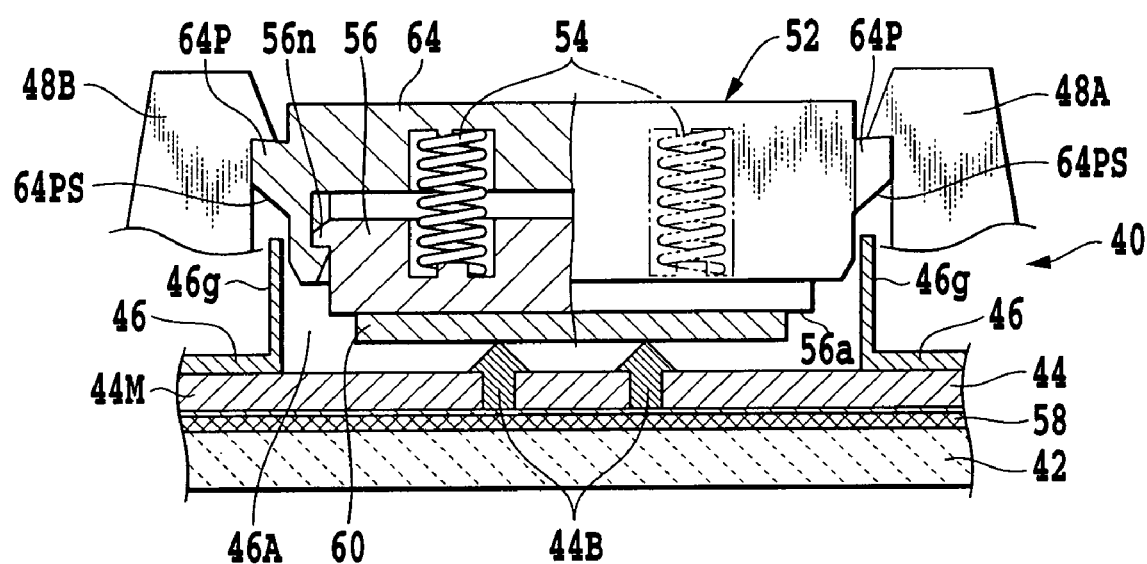
FIG. 8 is a partially sectional view schematically showing a structure of a carrier unit in the embodiment shown in FIG. 7.

As shown in FIG. 8, the carrier unit 40 includes a carrier housing 46 having an accommodation portion 46A for receiving a bare chip 60, the contact sheet 44 placed via an elastic sheet 58 on a base member 42 forming a bottom of the accommodation portion 46A in the carrier housing 46, a pressing covering 52 having a press body 56 for pressing an electrode group of the bare chip 60 to bumps 44B of the contact sheet 44, and a latch mechanism 50 (see FIG. 7) for selectively holding the pressing covering 52 to the carrier housing 46.

As shown in FIG. 8, the pressing covering 52 includes a press body 56 having a pressing surface 56a to be brought into contact with the upper surface of the bare chip 60, a covering body 64 for accommodating a proximal portion of the press body 56, and a plurality of springs 54 arranged in a space between the respective recess in the proximal portion of the press body 56 and a relatively deep recess in the covering body 64 opposite to the former recess, for biasing the press body 56 toward the bare chip 60.

The bare chip 60 of a generally square shape has a predetermined electrode group on a lower surface opposite to the bumps 44B of the contact sheet 44. Now that in FIG. 8, only two of the plurality of bumps 44B are typically illustrated in a relatively exaggerated manner.

The proximal portion of the press body 56 is inserted in a relatively shallow and wide recess in the covering body 64 in a movable manner. At an end of the proximal portion of the press body 56, a plurality of nibs 56n to be engaged with nibs provided at a lower end of the covering body 64 are formed opposite to each other. Thereby, the press body 56 is held by the covering body 64 while being biased by an elastic force of the spring 54.

The covering body 64 has a lug 64p at each of opposite ends thereof to be engaged with a hook member 48A or 48B in the latch mechanism 50. The lugs 64p have slanted surfaces 64ps for pressing the hook members 48A and 48B to be away from each other by the engagement with the slanted surfaces at tip ends of the hook members 48A and 48B, when the pressing covering 52 is mounted.

The latch mechanism 50 comprises of the hook members 48A and 48B supported at the opposite ends of the carrier housing 46 in a rotatable manner, for holding the covering body 64, a helical torsion spring 66 for biasing each of the hook members 48A and 48B in the direction shown by an arrow in FIG. 7 to engage the same with the lug 64p, and a pin 68 for supporting the helical torsion spring 66.

At each of opposite ends of the carrier housing 46, a guide section 46g is formed, for guiding the outer periphery of a lower portion of the covering body 64 when the pressing covering 52 is mounted. On the periphery of the guide section 46g, each of opposite ends of the pin 68 is supported.

Figure 9:
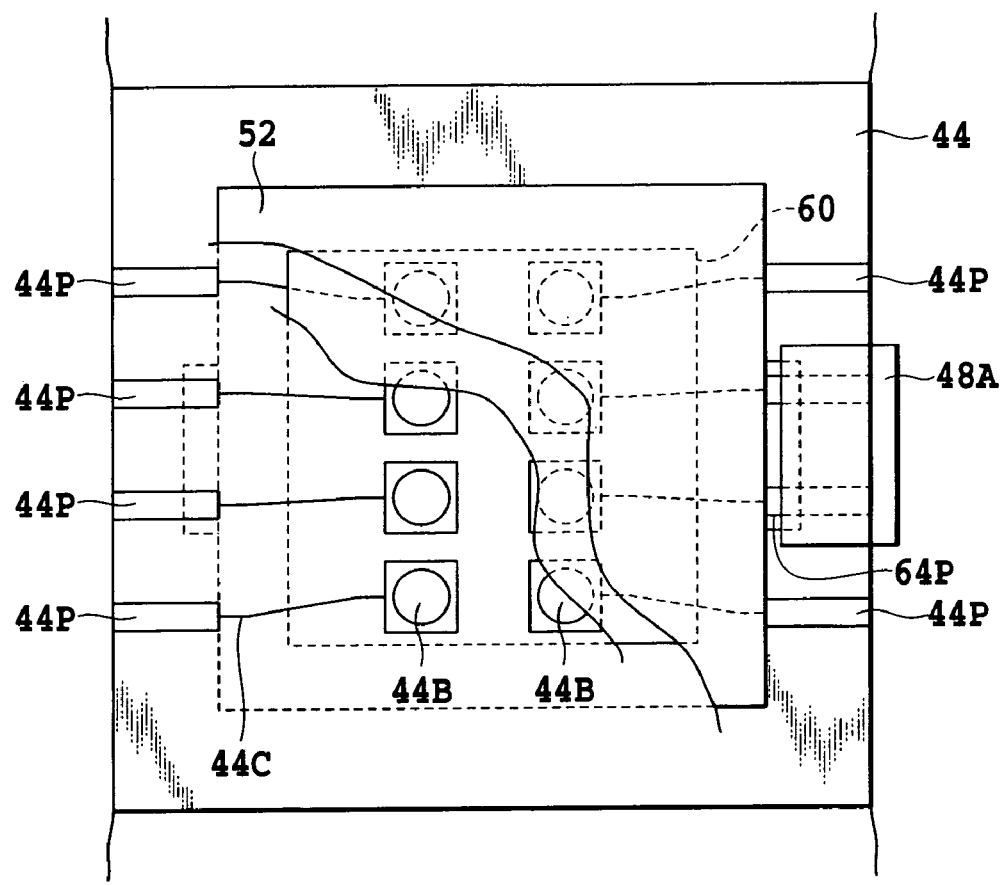
FIG. 9 is a plan view of the embodiment shown in FIG. 8.

As shown in FIGS. 8 and 9, the contact sheet 44 has a plurality of bumps 44B in a substrate 44M arranged in correspondence to the electrode group of the bare chip 60 to be electrically connected to the bumps. Note that, in FIG. 9, of the plurality of bumps 44B in the contact sheet 44, several of them are typically shown in a relatively exaggerated manner.

The respective bump 44B is formed by plating a surface of copper which is a base material with nickel and gold. A tip end of the respective bump 44B is projected only predetermined height from the surface of the substrate 44M. The substrate 44M is made, for example, of polyimide resin (having a coefficient of linear expansion of $35 \times 10^{-6}/°$ C.) to be a sheet approximately 40 μm in thickness.

The respective bump 44B is connected to a pad 44p via an conductive layer 44c formed of a copper foil as shown in FIG. 9. The pad 44p is formed at each of opposite ends of the substrate 44M projected outward from the base member 42 as shown in FIG. 7.

In this regard, a region in the contact sheet 44 in which the plurality of bumps 44B are formed is supported to be movable relative to the surface of the base member 42 in parallel thereto relatively in a predetermined range.

In such a structure, when the bare chip 60 is mounted in the carrier unit 40, the electrode group of the bare chip 60 is first positioned to the respective bumps 44B of the contact sheet 44 so that the electrode group of the bare chip 60 is brought into contact with the respective bumps 44B. Then, the pressing covering 52 is inserted into the accommodation portion 46A in the carrier housing 46. At tat time, tip ends of the hook members 48A and 48B of the latch mechanism 50 is made to move rotationally to be away from each other against the biasing force of the helical torsion spring 66 by the action of the slanted surface 64p of the covering body 64 in the pressing covering 52. Also, while being guided the outer peripheral surface of the covering body 64 by the inner surface of the guide section 46g, the pressing surface 56a of the press body 56 is pressed on the upper surface of the bare chip 60 against the biasing force of the spring 54.

Subsequently, the hook members 48A and 48B are made to move rotationally so that the tip ends thereof are close to each other by the bias of the helical torsion spring 66, and engaged with the lugs 64p of the covering body 64. As a result, the pressing covering 52 is held by the carrier housing 46.

In a state in which the carrier unit 40 is mounted to the accommodation portion 32A as described above, a test is carried out on the bare chip 60 in a predetermined atmosphere.

Upon such a test, the above-mentioned carrier unit 40 and contact sheet 44 are repeatedly used for a predetermined number of fresh bare chips mounted thereon.

Figure 5A:
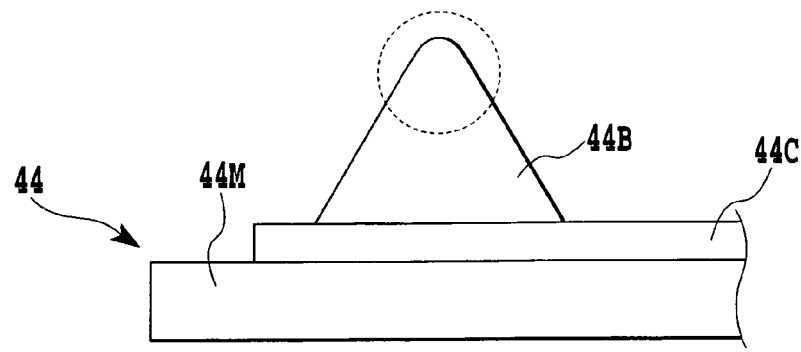
FIGS. 5A, 5B and 5C are views of illustrations made available for explaining the respective steps in which a tip end of a bump is worn during the use, respectively.
Figure 6A:
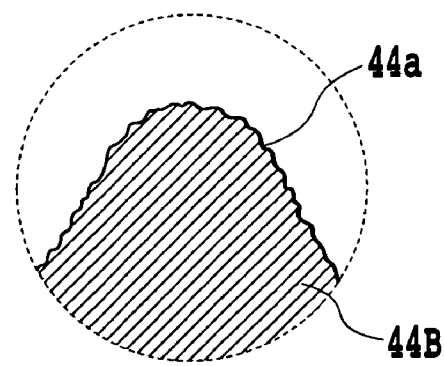
FIGS. 6A, 6B and 6C are partially enlarged views, respectively, of a tip end of a bump, made available for explaining the respective steps shown in FIGS. 5A, 5B and 5C in which the tip end of the bump is worn by using.

Prior to being used for such a test, the non-used each bump 44B originally has a generally conical shape as shown in FIG. 5A in an enlarged scale. At the topmost end of the bump 44B, micro-irregularity 44a is formed on the entirety of the surface thereof as shown in FIG. 6A in an enlarged scale.

Figure 5B:
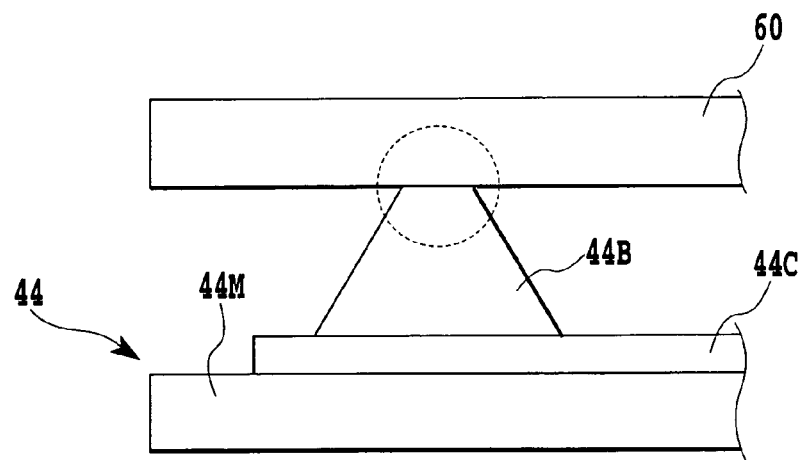
Figure 6B:
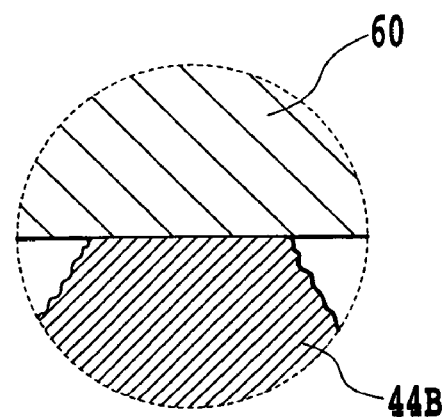

Next, when the contact sheet 44 is used for a test, the topmost end of the bump 44B is brought into contact with the electrode surface of the bare chip 60 at a predetermined pressure with a predetermined amount to be collapsed as shown in FIGS. 5B and 6B.

Figure 5C:
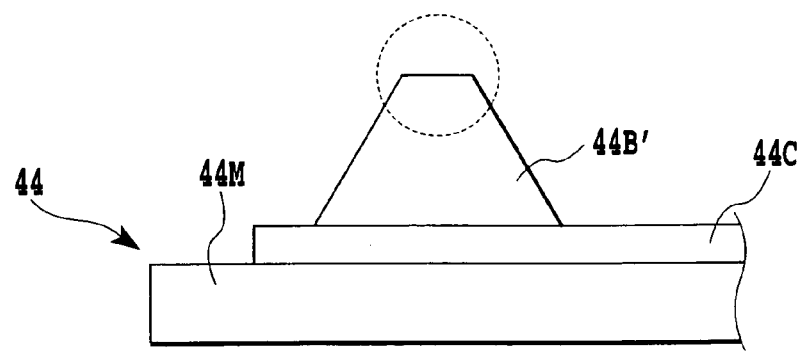
Figure 6C:
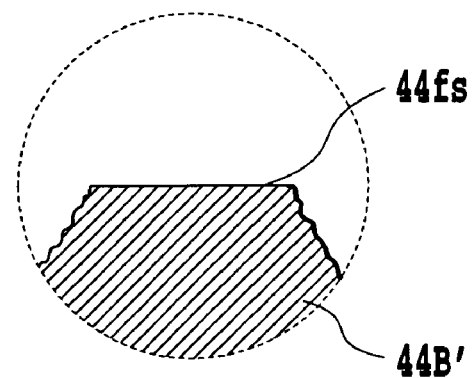

Subsequently, by repeatedly using one contact sheet 44 for a predetermined number of bare chips 60, the topmost end of the bump 44B' thus used is collapsed to be of a generally trapezoidal shape having a flat surface as enlargedly shown in FIGS. 5C and 6C. The smooth flat surface 44fs of such a bump 44B' does not have any micro-irregularity as shown in FIG. 6A.

Accordingly, when one contact sheet 44 has been used the predetermined number of times or more without changing the same, there might be a case in that the electric contact becomes unreliable between the contact sheet 44 and the bare chip 60.

Figure 1A:
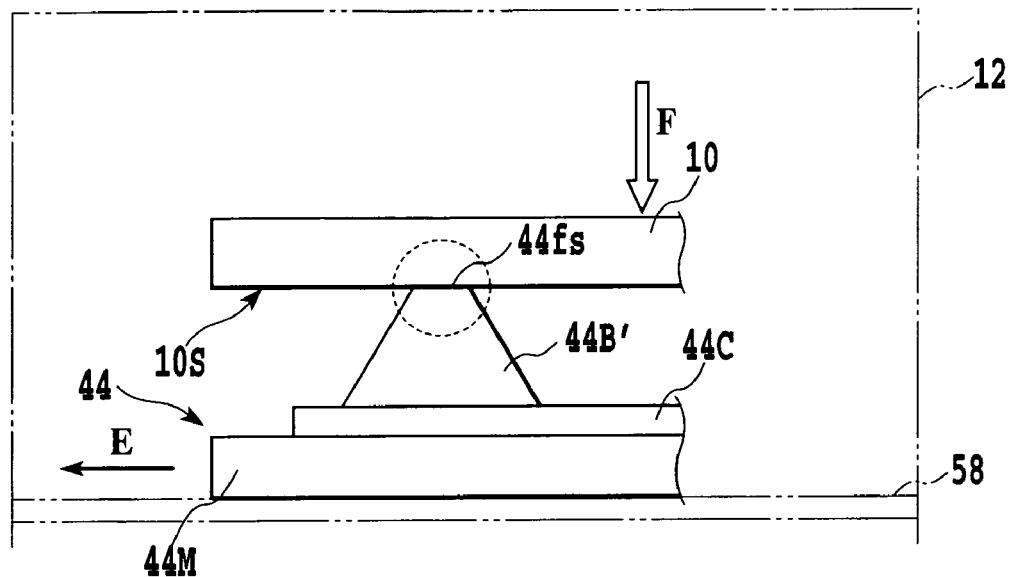
FIGS. 1A and 1B are schematic views of illustrating the respective steps of a first embodiment of a recovery processing method of an electrode according to the present invention, respectively.
Figure 2A:
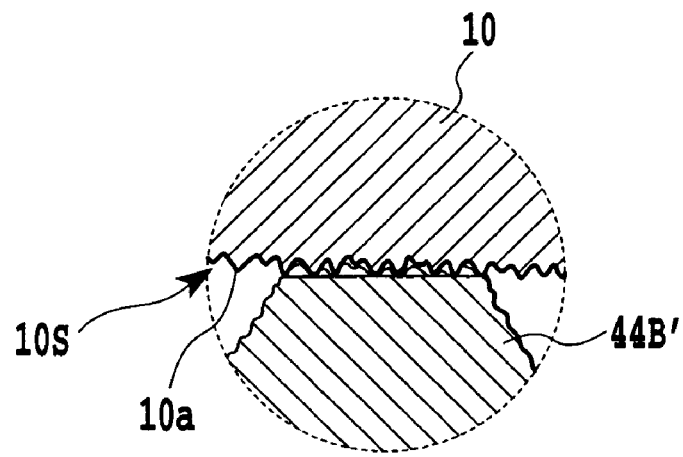
FIG. 2A is an enlarged partially sectional view of a tip end of a bump in the step shown in FIG. 1A, made available for explaining the respective step.

To solve such a problem, according to a first embodiment of a recovery processing method of an electrode according to the present invention, a transfer plate 10 having a predetermined thickness is prepared as shown in FIG. 1A. The transfer plate 10 is made of cold tool steel (Japanese Industrial standards mark SKS, SKD) plated with chromium as a surface treatment (having a coefficient of linear expansion of approximately $11.5 \times 10^{-6}/°$ C.), and has irregularity of a predetermined roughness on at least one transfer surface 10s as enlargedly shown in FIG. 2A.

First, the contact sheet 44, of which the bump 44B' is worn, is disposed as shown in FIG. 1A, and the above-mentioned carrier unit 40 on which is mounted the transfer plate 10 in place of the bare chip 60 is arranged in a constant temperature bath 12 for maintaining the room temperature at a predetermined value. The constant temperature bath 12 is provided with a temperature regulator capable of variously adjusting the room temperature.

At that time, the transfer plate 10 is placed on a common plane formed of a plurality of flat surfaces 44fs so that a transfer surface 10s thereof is brought into contact with worn flat surfaces 44fs of the respective bumps 44B' in the constant temperature bath 12. Thus, the transfer plate 10 is supported by the flat surfaces 44fs of a plurality of bumps 44B'. At that time, the transfer surface 10s is pressed onto the plurality of bumps 44B' at a predetermined pressure in the direction shown by an arrow F in FIG. 1A by a biasing force of the spring 54 via the press body 56 as above. This pressure is set, for example, at a value in a range from approximately 1 to 100 g per one bump 44B'. According to the study of the present inventors, if the pressure is less than approximately 1 g per one bump 44B', there is hardly a recovery effect, while if exceeding 100 g per one bump 44B', the projected height of the bump 44B' becomes too low in comparison with a standard value. In addition, in the latter case, since it has been proved that the collapse of the tip end of the bump 44B' becomes relatively large to damage the electrode of the device being tested, the pressure is selected from the above-mentioned range from approximately 1 to 100 g per one bump 44B', for example.

Figure 3A:
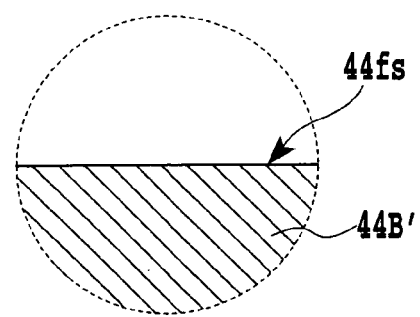
FIGS. 3A, 3B, 3C and 3D are enlarged partially sectional views, respectively, of a tip end of a bump in the respective steps of the first embodiment, made available for explaining the respective steps.
Figure 3B:
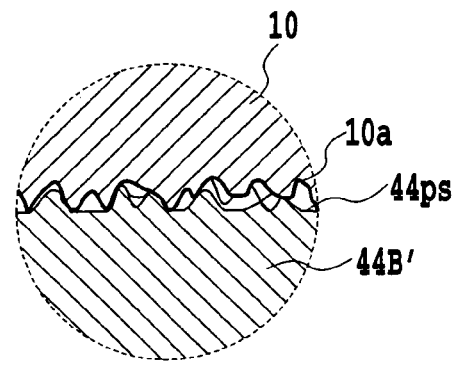

FIG. 3B illustrates the tip end of the bump 44B' in an enlarged scale, immediately after the transfer surface 10s has been brought into contact with the flat surface 44fs and pressed. Thus, as apparent from FIG. 3B, the tip end of the bump 44B' is pressed by the irregularity 10a of the transfer plate 10 to have a relatively rough irregularity 44ps.

Then, the temperature in the constant temperature bath 12 rises, for example, from a standard condition to a range from 80 to 150° C., and maintained at this temperature for not less than 5 minutes. In this regard, the temperature in the constant temperature bath 12 and the time period for maintaining this temperature are set preferably approximately 15 minutes at 150° C., respectively.

Figure 3C:
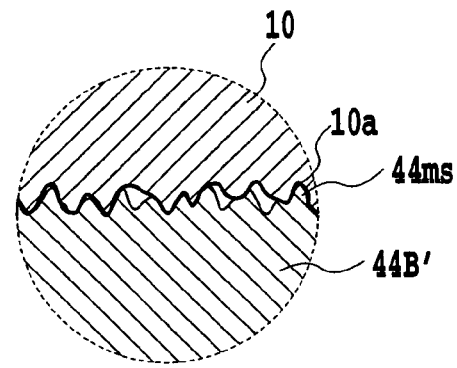

Accordingly, when the transfer plate 10 and the contact sheet 44 expand in the direction shown by an arrow E in FIG. 1A as the room temperature rises, the contact sheet 44 elongates longer than the elongation of the transfer plate 10 against the mutual frictional force between the irregularity 44ps and the transfer surface 10s shown in FIG. 3B, since the linear thermal coefficient of expansion of the substrate 44M is set to be larger than the coefficient of linear expansion of the transfer plate 10 as described above. As a result, the surface on which the irregularity 44ps is formed is further scraped by the relative slide of approximately several tens μm of the contact sheet 44 and the bump 44B' to the micro-irregularity 10a on the transfer surface 10s to result in a finer irregularity 44ms on the surface of the bump as shown in FIG. 3C.

Figure 1B:
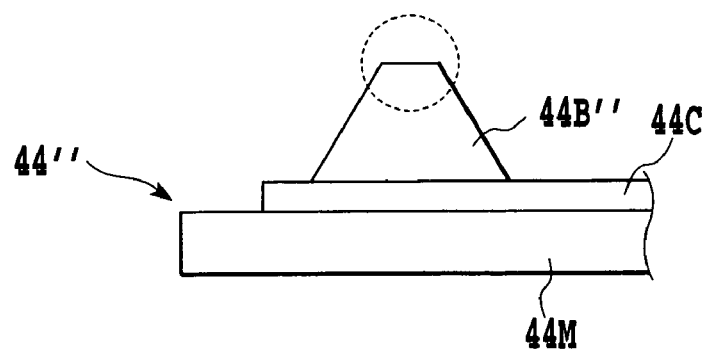

Subsequently, the contact sheet 44" having the bump 44B" subjected to the recovery treatment is removed from the carrier unit 40 as shown in FIG. 1B.

Figure 2B:
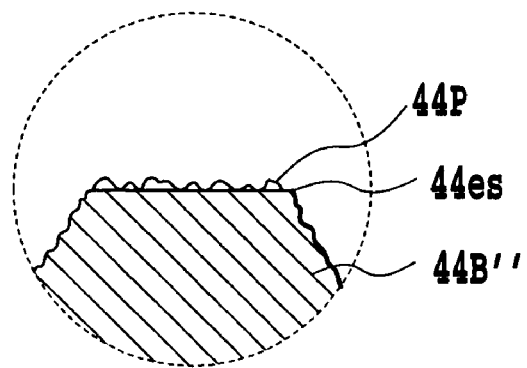
FIG. 2B is an enlarged partially sectional view of a tip end of a bump in the step shown in FIG. 1B, made available for explaining the respective step.
Figure 3D:
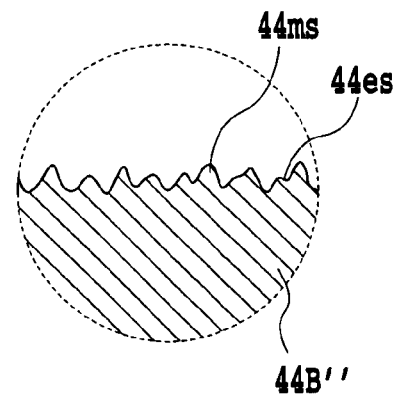

Thus, as shown in FIGS. 2B and 3D in an enlarged scale, a relatively fine irregularity 44ms is formed in the topmost end surface 44es of the bump 44B" in correspondence to the press and slide of the micro-irregularity 10a of the transfer surface 10s in the transfer plate 10 without applying a relatively large pressure.

As described above, since the bump 44B is easily deformable by the heating, the formation of the above irregularity is further facilitated.

Figure 4A:
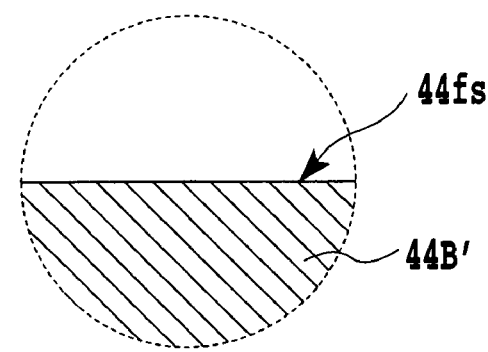
FIGS. 4A, 4B and 4C are enlarged partially sectional views, respectively, of a tip end of a bump in the respective steps of a comparative example, made available for explaining the respective steps.
Figure 4B:
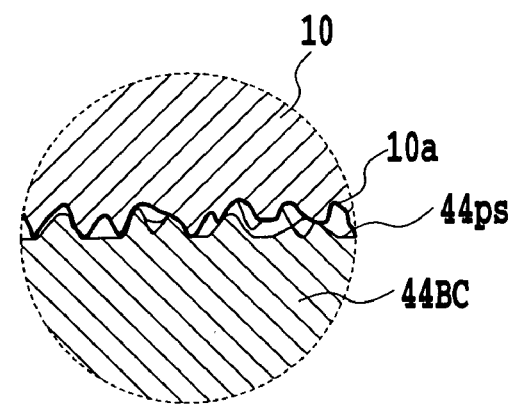
Figure 4C:
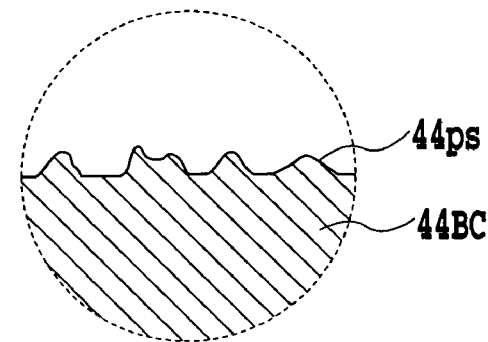

FIGS. 4A, 4B and 4C illustrate the respective steps for processing the bump 44B' in a comparative example proved by the present inventors.

In this comparative example, upon the recovery treatment of the electrode, the contact sheet 44 having the worn bump 44B' as shown in an enlarged scale in FIG. 4A similar to the above embodiment is disposed in the carrier unit 40 as in the above-described embodiment, and the transfer plate 10 is solely mounted in place of the bare chip 60 without being heated.

In this comparative example, the bump 44B' is pressed by the transfer plate 10 at a predetermined pressure in the direction shown by an arrow F in FIG. 1A by the bias of the spring 54 via the press body 56. FIG. 4B illustrates the tip end of the bump 44BC in an enlarged scale immediately after the transfer surface 10s is brought into contact with the flat surface 44fs and pressed thereby. Thereby, as apparent from FIG. 4B, the tip end of the bump 44BC is pressed by the irregularity 10a of the transfer plate 10 and a relatively rough irregularity 44ps is formed.

Next, the contact sheet having the recovered bump 44BC is removed from the carrier unit.

Thus, as shown in FIG. 4C in an enlarged scale, a relatively rough irregularity 44ps is formed in the topmost end surface of the bump 44BC in correspondence to the micro-irregularity 10a of the transfer surface 10s in the transfer plate 10.

As a result, it has been confirmed that the relatively fine irregularity 44ms as obtained by the first embodiment of the present invention is not obtainable by the method according to the comparative example.

In addition, in the present invention, the filing effect is obtained in the connection surface of the bump 44B by the relative slide between the above-mentioned transfer surface 10s and the bump 44B. Further, in comparison with a case in which the transfer is carried out only by the press action, it is possible to assuredly form the finer irregularity.

Figure 10A:
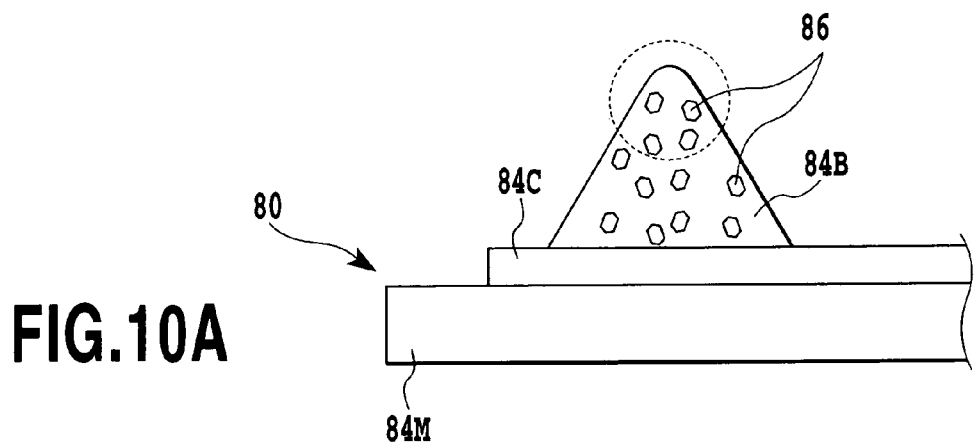
FIGS. 10A, 10B and 10C are enlarged partially sectional views, respectively, of a important portion made available for explaining the respective steps in a second embodiment of a recovery processing method of an electrode according to the present invention.
Figure 10B:
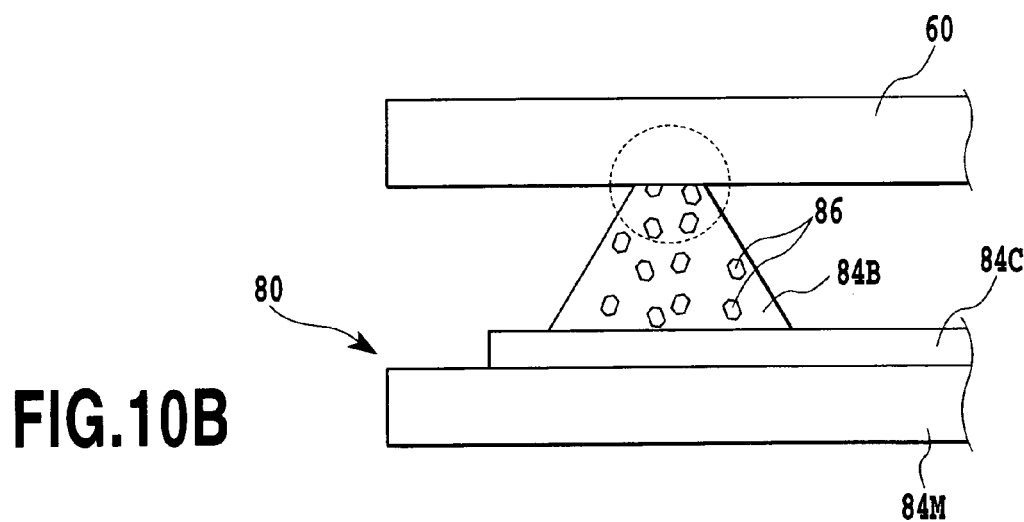
Figure 10C:
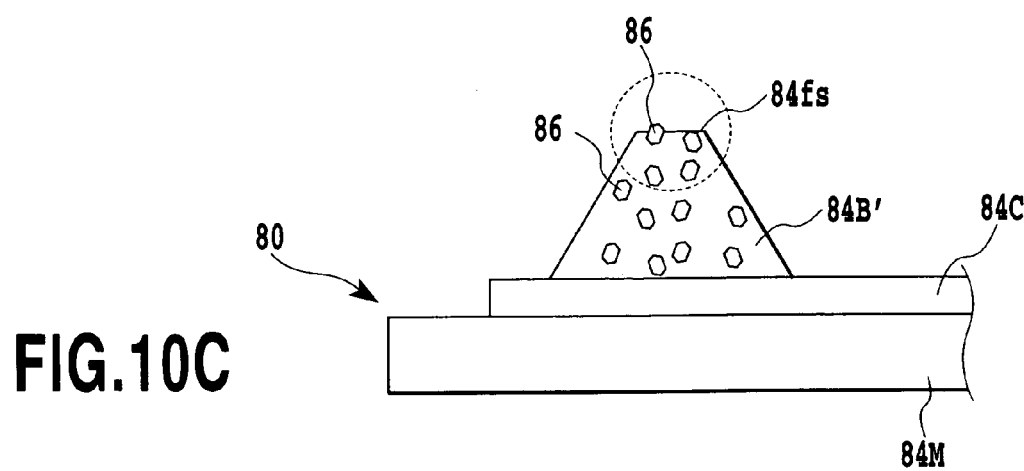

FIGS. 10A, 10B and 10C schematically illustrate the respective steps in the second embodiment of a recovery processing method of an electrode according to the present invention.

Figure 11A:
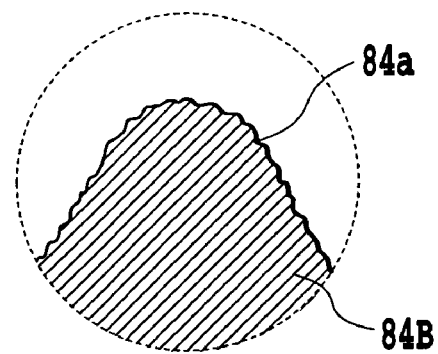
FIGS. 11A, 11B and 11C are enlarged partially sectional views, respectively, of a portion shown in FIGS. 10A, 10B and 10C.

A contact sheet 80 used in the embodiment shown in FIGS. 10A to 10C has a plurality of bumps 84B arranged in a substrate 84M in correspondence to an electrode group of a bare chip 60 to be electrically connected thereto as shown in FIG. 10A. A tip end of the respective bump 84B is projected at a predetermined height from the surface of the substrate 84M. A micro-irregularity 84a is formed over the entirety of the surface of the tip end thereof as shown in FIG. 11A in an enlarged scale.

The respective bump 84B is electrically connected to a pad (not shown) via a conductive layer 84C formed of copper foil. The pad is formed at each of the opposite ends of the substrate 84M projected from each of the opposite ends of the base member 42. The respective bump 84B is formed of material in which gold (having Knoop hardness in a range from 80 to 200) or copper (having Knoop hardness in a range from 250 to 320) is used as a base material and uniformly mixed with predetermined crystalline materials 86, to have a generally conical shape.

When the base material is gold, the crystal particle 86 is made of palladium (Pd) to have a diameter approximately in a range from 2 to 3 µm, which has a hardness higher than that of gold and a relatively high electric conductivity, and the content thereof is approximately in a range from 12 to 20%/vol.

When the base material is copper, the crystal particle 86 is made of nickel (Ni) to have a diameter approximately in a range from 2 to 3 µm, which has a hardness higher than that of copper and a relatively high electric conductivity, and the content thereof is approximately in a range from 15 to 20%/vol.

The substrate 84M is made, for example, of polyimide resin (having a coefficient of linear expansion of $35 \times 10^{-6}/°$ C.) to be a sheet of approximately 40 µm in thickness.

Upon the recovery treatment of the bump 84B as an electrode of such a concrete sheet 80, while one contact sheet 80 is disposed in the above-mentioned carrier unit 40, the tip end of the bump 84B is repeatedly brought into contact with the bare chips 60 during the use, whereby the connection surface of the tip end of the bump 84B is automatically recovered. Accordingly, the pressing step and the heating step of the transfer plate 10 used in the first embodiment becomes unnecessary.

Figure 11B:
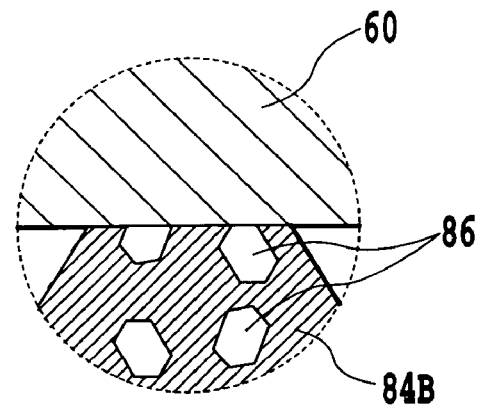

That is, when the contact sheet 80 in the carrier unit 40 is subjected the test, the topmost end of the bump 84B is brought into contact with the electrode surface of the bare chip 60 at a predetermined pressure with a predetermined amount to be collapsed as shown in FIGS. 10B and 11B in an enlarged scale.

Figure 11C:
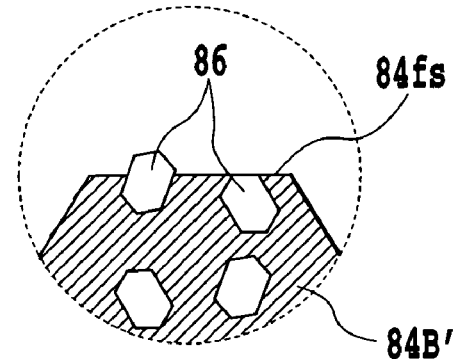

Subsequently, while the one contact sheet 80 is repeatedly used for testing a predetermined number of bare chips 60, the topmost end of the respective bump 84' is collapsed to be a generally trapezoidal shape having a generally flat surface as shown in FIGS. 10C and 11C in an enlarged scale. Part of the plurality of crystalline materials 86 contained in the base material is exposed on the tip end surface 84fs of such a bump 84B' as shown in FIG. 11C by the wear of the base material to form micro-irregularity.

Accordingly, a fresh surface having micro-irregularity is automatically formed on the topmost end surface of the respective bump 84B' as the base material at the topmost end of the bump 84B' is worn.

In the carrier unit 40 used in the first embodiment of a recovery processing method of an electrode according to the present invention, a portion in the contact sheet 44 in which a plurality of bumps 44B are formed is supported to be movable relative to the surface of the base member 42 in a predetermined range.

However, the carrier unit 40 is not necessary to have such a structure, but may be of those shown in FIGS. 12A, 12B to FIGS. 14A, 14B.

Figure 12A:
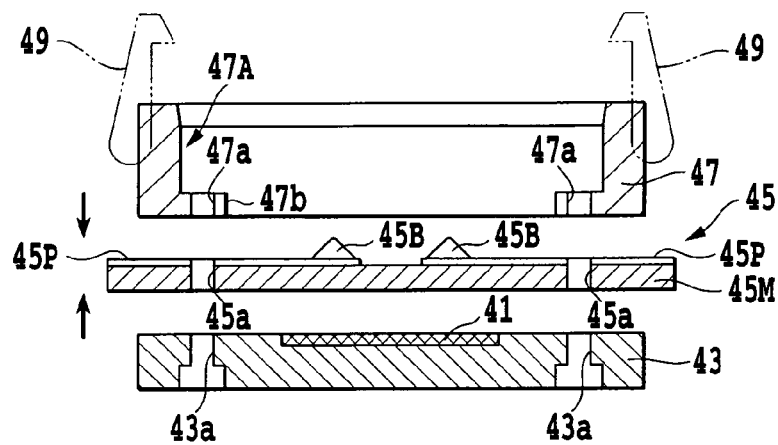
FIG. 12A is an exploded block diagram showing a structure of an example of another carrier housing and base member used in the first embodiment of a recovery processing method of an electrode according to the present invention.

In FIG. 12A, the carrier unit includes a carrier housing 47 having an accommodation portion 47A for receiving a bare chip 60 or a transfer plate 10, the contact sheet 45 placed via an elastic sheet 58 on a base member 42 forming a bottom of the accommodation portion 47A in the carrier housing 47, a pressing covering 52 (see FIG. 8) having a press body 56 for pressing an electrode group of the bare chip 60 or the transfer plate 10 to bumps 45B in the contact sheet 45, and a latch mechanism 49 for selectively holding the pressing covering 52 to the carrier housing 47. In this regard, since the structure of the pressing covering 52 and the latch mechanism 49 is the same as that of the pressing covering and the latch mechanism of the first embodiment, the explanation thereof will be eliminated.

Figure 12B:
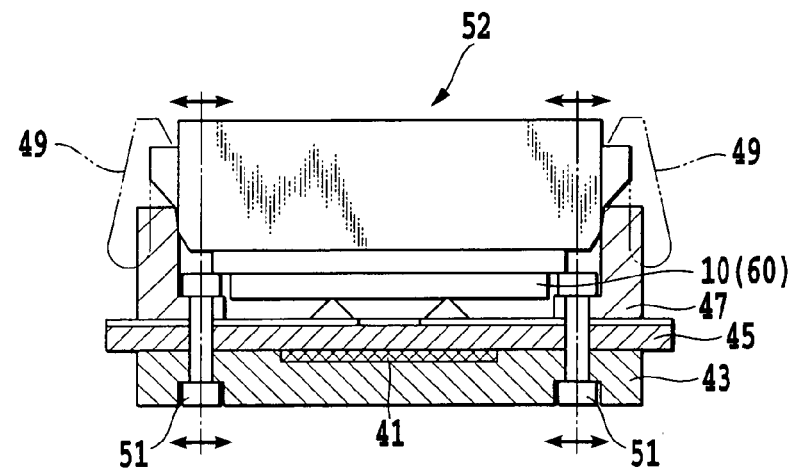
FIG. 12B is a block diagram illustrating a structure of a carrier unit including the carrier housing in FIG. 12A.

The carrier housing 47 is molded of material having the coefficient of linear expansion larger than that of the above-mentioned transfer plate 10, such as resinous material. Preferably, the resinous material is polyether imide (having the coefficient of linear coefficient of $56 \times 10^{-6}/°$ C.). As shown in FIG. 12B, the inner periphery of the accommodation portion 47A of the carrier housing 47 is formed to guide the outer periphery of the pressing covering 52 and located the cover at a predetermined position when the pressing covering 52 is mounted. On the bottom of the accommodation portion 47A of the carrier housing 47, four holes 47a are formed around a center opening 47b, in which are inserted fastener members 51 described later.

The contact sheet 45 has a plurality of bumps 45B in a substrate 45M arranged in correspondence to the electrode group of the bare chip 60 to be electrically connected to the bumps. A tip end of the respective bump 45B is projected from the surface of the substrate 45M at a predetermined height, for example. The respective bump 45B is formed by plating the surface of copper which is a base material thereof with nickel and gold. The substrate 44M is made, for example, of polyimide resin (having a coefficient of linear expansion of $35 \times 10^{-6}/°$ C.) to be a sheet form of approximately 40 µm in thickness.

The respective bump 45B is connected to a pad 45p via an conductive layer formed of a copper foil. The plurality of pads 44p are formed at each of opposite ends of the substrate 45M projected outward from the base member 43.

The contact sheet 45 has holes 45a in which are inserted fastener members 51 around a plurality of bumps 44B in correspondence to the holes 47a of the carrier housing 47.

The base member 43 is molded of the same material as that of the carrier housing 47 and has holes 43a in correspondence to the holes 47a of the carrier housing 47 and the holes 45a of the contact sheet 45.

One of roles of the elastic sheet 41 disposed directly beneath the plurality of bumps 44B of the contact sheet 45 is to equalize the variation of a contacting force of the bump 45B caused by the projected height of the respective bump 45B in the same manner as in the preceding embodiment.

As shown in FIG. 12B, the fastener member 51 for fastening the carrier housing 47 and the base member 43 together while intervening the contact sheet 45 between the both is preferably a rivet or a combination of bolt and nut, for example.

When such a carrier unit is used, upon the recovery treatment of the bump, the contact sheet 45 having the worn bumps is first placed thereon, and the carrier unit on which the transfer plate 10 is mounted in place of the bare chip 60 is put into the constant temperature bath 12 in which the room temperature is maintained at a predetermined value.

The condition of the pressure is determined in the same manner as in the preceding first embodiment.

Then, the room temperature in the constant temperature bath 12 rises from the standard condition to a range from 80 to 150° C. and is maintained at this temperature for 5 minutes or longer. The temperature in the constant temperature bath 12 and the period for maintaining the temperature are preferably 150° C. and 15 minutes.

Thus, when the transfer plate 10, the base member 43, the carrier housing 47 and the contact sheet 45 expand as the room temperature rises, the contact sheet 45 more relatively expands than the transfer sheet 45 against the mutual frictional force between the former and the transfer surface 10s because the coefficient of linear expansion of the carrier housing 47 or others is set to be larger than that of the transfer plate 10. As a result, since the respective bump 45B moves together with the contact sheet 45 in the same manner as in the first embodiment, irregularities having finer surface roughness is formed at a tip end of the respective bump 45B.

Figure 13A:
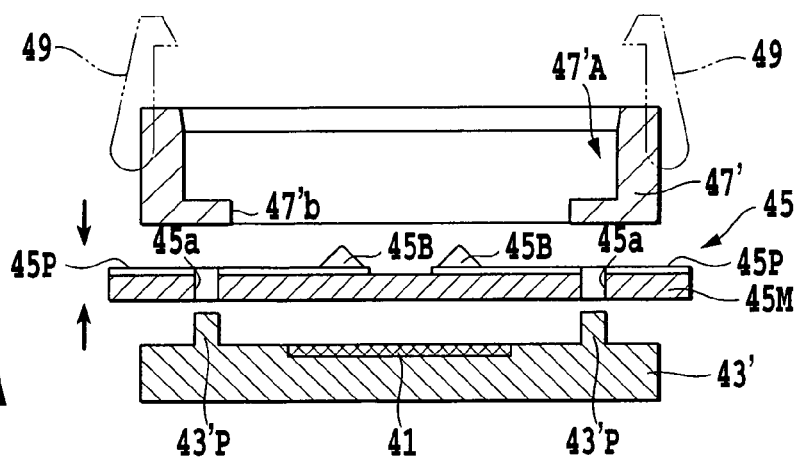
FIG. 13A is an exploded block diagram showing a structure of an example of a further carrier housing and base member used in the first embodiment of a recovery processing method of an electrode according to the present invention.
Figure 13B:
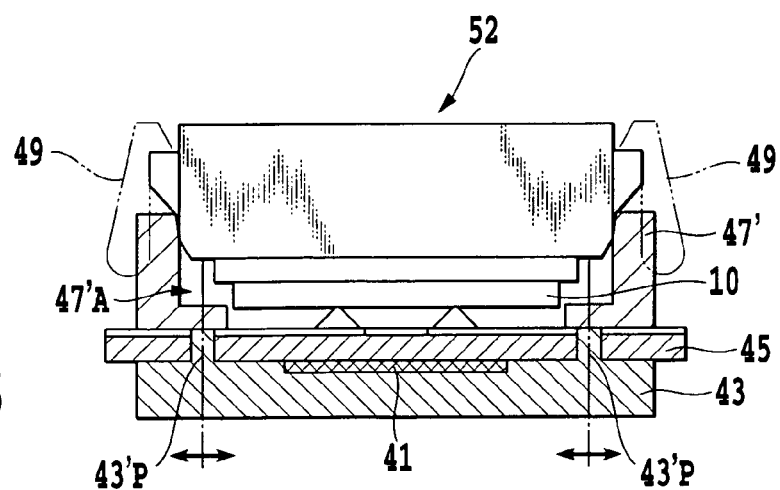
FIG. 13B is a block diagram illustrating a structure of a carrier unit including the carrier housing in FIG. 13A.

FIGS. 13A and 13B illustrate another carrier unit used in one embodiment of a recovery processing method of an electrode according to the present invention.

While the carrier housing 47 and the base member 43 are fastened together by the fastener members 51 while intervening the contact sheet 45 between the both in the carrier unit shown in FIGS. 12A and 12B, the carrier housing 47 and the base member 43 are bonded together by an adhesive or welding while intervening the contact sheet 45 between the both in the carrier unit shown in FIGS. 13A and 13B. In this regard, in FIGS. 13A and 13B, the same reference numerals are used for denoting the same elements as in FIGS. 12A and 12B and the explanation thereof will be eliminated.

The carrier housing 47' is molded of material having the coefficient of linear expansion larger than that of the above-mentioned transfer plate 10, such as resinous material. As the resinous material, polyether imide (having the coefficient of linear expansion of $56 \times 10^{-6}$/° C.) is preferable, for example. The inner periphery of the accommodation portion 47' B is formed to guide the outer periphery of the pressing covering 52 to locate the same at a predetermined position as shown in FIG. 13B when the pressing covering 52 is mounted. In the bottom surface of the accommodation portion 47' of the carrier housing 47', an opening 47' b is formed at a center thereof.

The base member 43' is molded of the same material as that of the carrier housing 47', and has four positioning pins 43' P in correspondence to the holes 45a of the contact sheet 45, respectively. The positioning pin 43' P is projected from the surface on which the elastic sheet 41 is arranged at a predetermined length, for example, that corresponding to a thickness of the contact sheet 45. The positioning pin 43' P determines a relative position of the contact sheet 45 to the base member 43' and displaces the contact sheet 45 in accordance with the thermal expansion or shrinkage of the base member 43' in the same manner. The relative position of the base member 43' to the accommodation portion 47' of the carrier housing 47' is determined when being welded.

Also in this embodiment, since the coefficient of linear expansion of the base member 43', the carrier housing 47' and the contact sheet 45 is selected to be larger than that of the transfer plate 10, the contact sheet 45 extends larger than the elongation of the transfer plate 10 against the mutual frictional force between the contact sheet and the transfer surface 10s. As a result, in the same manner as in the first embodiment, the respective bump 45B moves together with the contact sheet, and a finer surface roughness is formed at a tip end of the respective bump 45B.

Figure 14A:
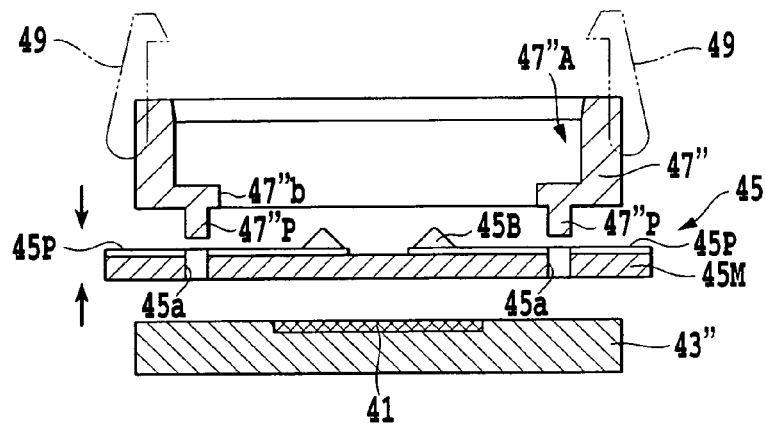
FIG. 14A is an exploded block diagram showing an example of a furthermore carrier housing and base member used in the first embodiment of a recovery processing method of an electrode according to the present invention.
Figure 14B:
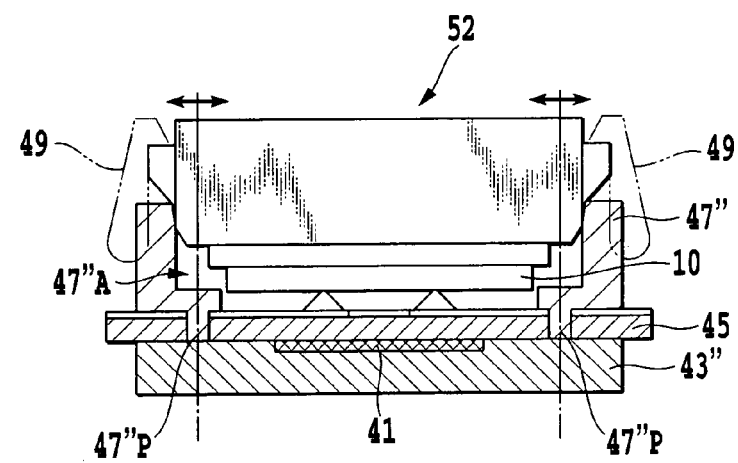
FIG. 14B is a block diagram illustrating a structure of a carrier unit including the carrier housing in FIG. 14A.

FIGS. 14A and 14B shows a further carrier unit used in one embodiment of a recovery processing method of an electrode according to the present invention.

The carrier housing 47' and the base member 43' having the positioning pins 43' P are bonded together while intervening the contact sheet 45 between the both in the carrier unit shown in FIGS. 13A and 13B. On the other hand, in FIGS. 14A and 14B, a carrier housing 47" having positioning pins 47"P and a base member 43" are bonded together while intervening the contact sheet 45 between the both. In this regard, in FIGS. 14A and 14B, the same reference numerals are used for denoting the same elements in FIGS. 12A and 12B, and the explanation thereof will be eliminated.

The carrier housing 47" is molded of material having the coefficient of linear expansion larger than that of the above-mentioned transfer plate 10, such as resinous material. Preferably, the resinous material is polyether imide (having the coefficient of linear coefficient of $56 \times 10^{-6}$/° C.). As shown in FIG. 14B, the inner periphery of the accommodation portion 47" A of the carrier housing 47" is formed to guide the outer periphery of the pressing covering 52 and located the cover at a predetermined position when the pressing covering 52 is mounted. On the bottom of the accommodation portion 47" A of the carrier housing 47", an opening 47" b is formed at a center thereof. Four positioning pins 47" P are projected on the outer periphery of the opening 47". The positioning pin 47" P is projected from the bottom at a predetermined length, for example, that corresponding to a thickness of the contact sheet 45. The positioning pin 47" P determines a relative position of the contact sheet 45 to the carrier housing 47' and displaces the contact sheet 45 in accordance with the thermal expansion or shrinkage of the carrier housing 47" in the same manner. The relative position of the carrier housing 47" to the accommodation portion 47' of the carrier housing 47" is determined when being welded.

The base member 43" is molded of the same material as that of the carrier housing 47".

Also in this embodiment, since the coefficient of linear expansion of the base member 43", the carrier housing 47" and the contact sheet 45 is selected to be larger than that of the transfer plate 10, the contact sheet 45 extends larger than the elongation of the transfer plate 10 against the mutual frictional force between the contact sheet and the transfer surface 10s. As a result, in the same manner as in the first embodiment, the respective bump 45B moves together with the contact sheet, and a finer surface roughness is formed at a tip end of the respective bump 45B.

Figure 15:
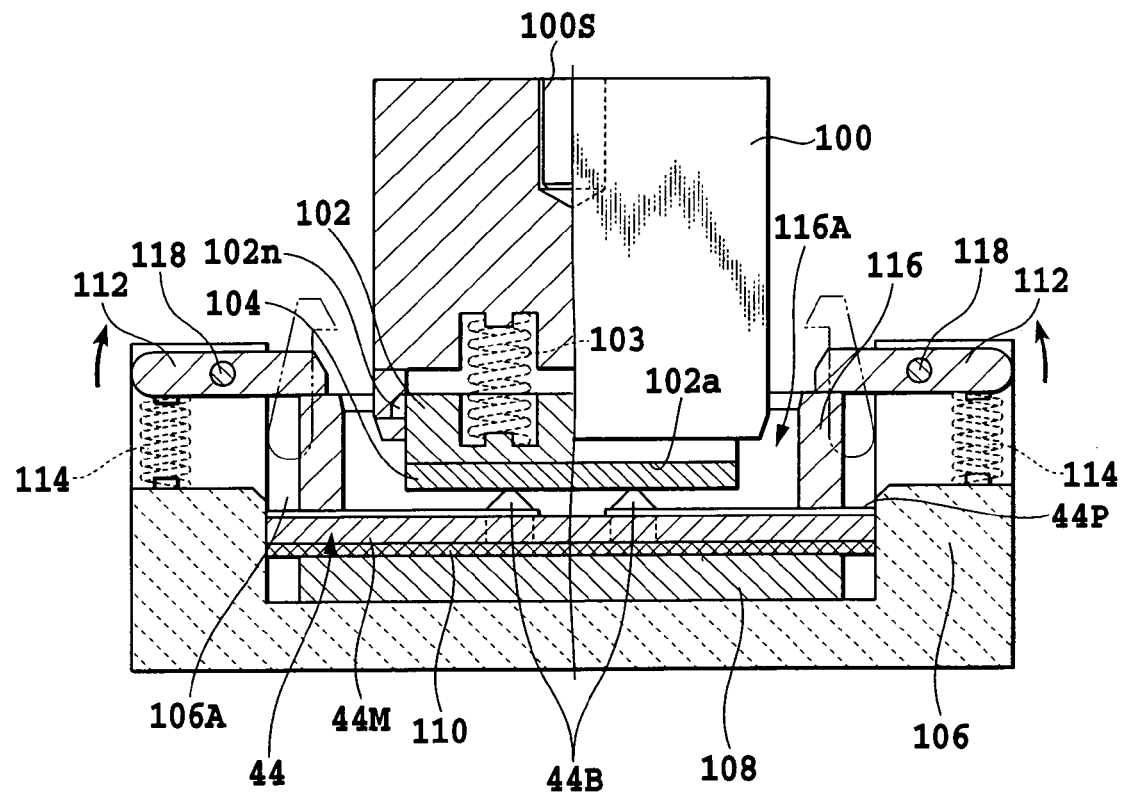
FIG. 15 is a sectional view illustrating a structure of a carrier unit stage together with a transfer plate fixing head used in a third embodiment of a recovery processing method of an electrode according to the present invention.
Figure 16:
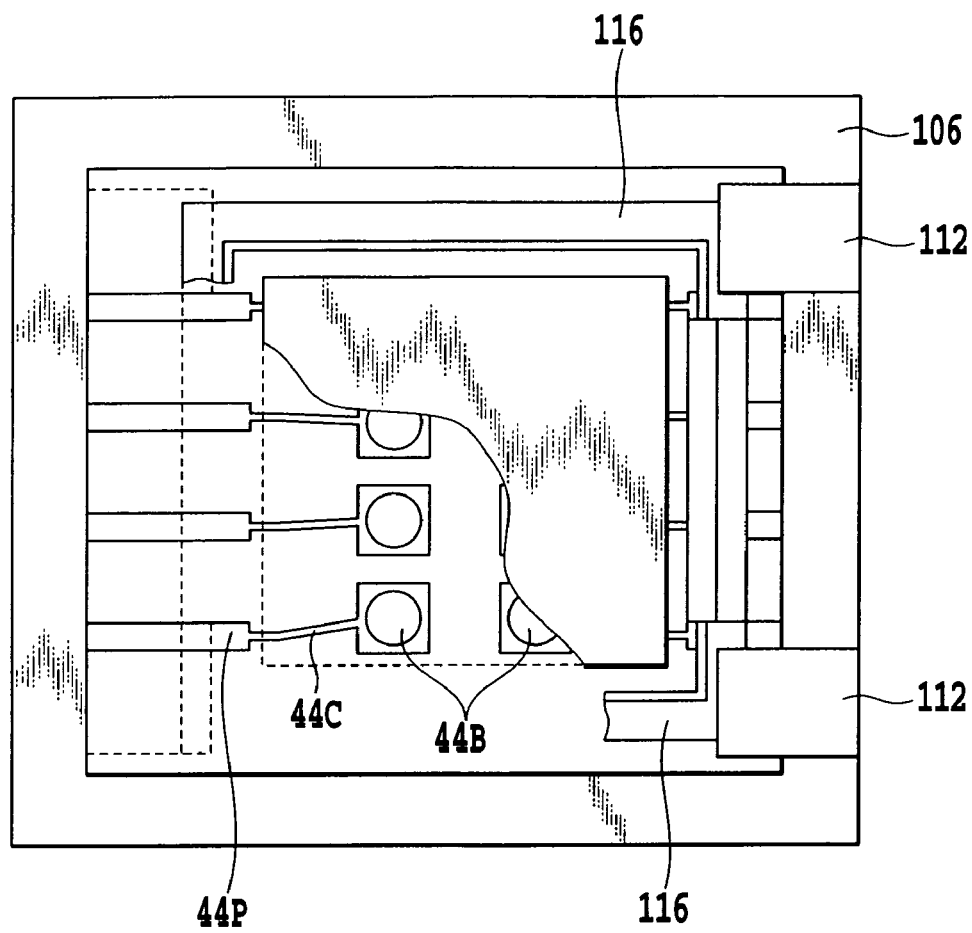
FIG. 16 is a plan view of the embodiment shown in FIG. 15.

FIGS. 15 and 16 illustrate a carrier unit stage together with a transfer plate fixing bead used in a third embodiment of a recovery processing method of an electrode according to the present invention.

In this regard, in FIGS. 15 and 16, the same reference numerals are used for denoting the same elements in FIGS. 7 and 8, and the explanation thereof will be eliminated. Also, in FIGS. 15 and 16, a state is illustrated in which part of constituent elements of the carrier unit are held in the carrier unit stage while the pressing covering is removed.

Figure 17:
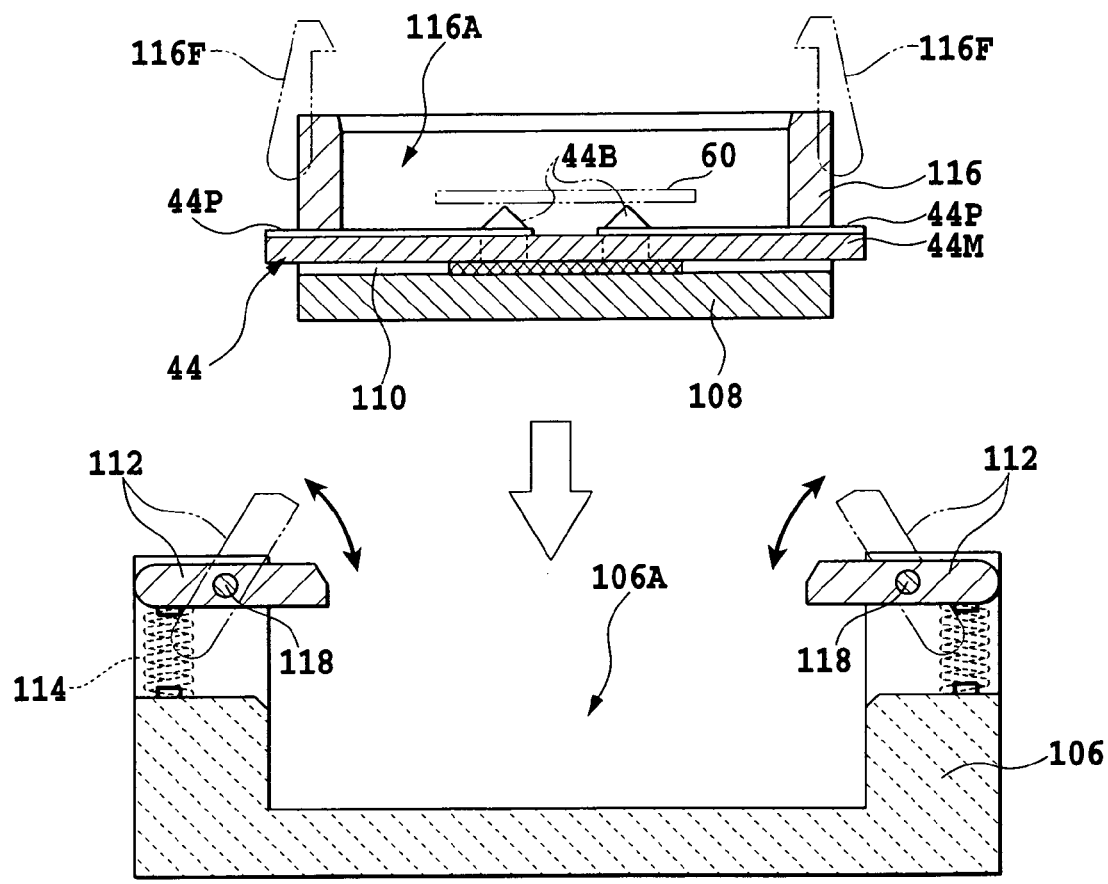
FIG. 17 is an exploded block diagram illustrating a structure of the carrier housing and the carrier unit stage shown in FIG. 15.

As part of the carrier unit is shown in FIGS. 15 and 17, the carrier unit includes a carrier housing 116 having an accommodation portion 116A for receiving a bare chip 60, the contact sheet 44 placed via an elastic sheet 110 on a base member 108 forming a bottom of the accommodation portion 116A of the carrier housing 116, a pressing covering (not shown) having a press body for pressing an electrode group of the bare chip 60 to bumps 44B in the contact sheet 44, and a latch mechanism 116F for selectively holding the pressing covering on the carrier housing 116.

In this regard, the above-mentioned pressing covering not shown has the same structure as in the embodiment shown in FIG. 8.

The latch mechanism 116F has a hook member at each of the opposite ends of the carrier housing 116 held for rotation by a pin as shown in FIG. 7, for holding an end of the pressing covering, and a coil spring for biasing the hook member in the direction to be engaged with the end of the pressing covering.

The carrier unit stage 106 has an accommodation portion 106 for temporarily accommodating the carrier housing 116 upon the recovery treatment of the bump 44B in the contact sheet 44. As shown in FIGS. 15 and 17, the inner periphery of the accommodation portion 106A opening upward is formed to be engaged with an end of the base member 108 for restricting a position of the base member 108 relative to the base member 108.

On the periphery of the accommodation portion 106A, a pair of latch mechanisms are opposed to each other for detachably holding the carrier housing 116 of the carrier unit as shown in FIGS. 16 and 17. The latch mechanism has a hook member 112 for holding the periphery of the accommodation portion 116A in the carrier housing 116, and a coil spring 114 for biasing the hook member 112 in the direction to be engaged with the periphery of the accommodation portion 116A. The hook member 112 is supported for rotation on the wall defining the accommodation portion 106A in the carrier unit stage 106 by a pin 118.

The hook member 112 is made to rotate when the carrier housing 116 of the carrier unit is solely mounted to the accommodation portion 106A or removed from the accommodation portion 106A, so that one end thereof is apart from the interior of the accommodation portion 106A against the bias of the coil spring 114 as shown by a chain double-dashed line in FIG. 17. On the other hand, when the carrier housing 116 is held in the interior of the accommodation portion 106A, one end of the hook member 112 is brought into contact with the periphery of the accommodation portion 116A of the carrier housing 116 by the bias of the coil spring 114 as shown by a solid line in FIGS. 15 and 17.

As described later, the transfer plate fixing head is disposed in the accommodation portion 116A of the carrier housing 116 as shown in FIG. 15 when the recovery processing is carried out on the contact sheet 44 having the worn bumps.

As shown in FIG. 15, the transfer plate fixing head has a press body 102 having a fixing surface 102a on which the transfer plate 104 is fixed, a covering body 100 having a recess for receiving a base of the press body 102, and a plurality of springs 103 for biasing the transfer plate 104 toward the bumps 44B of the contact sheet 44. The respective spring 103 is arranged in each of spaces defined between a recess in the base of the press body 102 and the relatively deep recess in the covering body 100.

The base of the base of the press body 102 is inserted to be movable into the relatively shallow and wide recess in the covering body 100. At an end of the inserted portion of the press body 102, a plurality of nibs 102n to be engaged with nibs provided at a lower end of the covering body 100 are opposed to each other. Thereby, the press body 102 is held by the covering body 100 while being held by the bias of the plurality of springs 103.

One surface of the transfer plate 104 made of metal or ceramic is fixed to the fixing surface 102a by an adhesive or fastening means. On the other surface of the transfer plate 104, an irregularity having a predetermined flatness and surface roughness is formed. In this regard, the transfer plate 104 should not be limited to this embodiment but may be formed to be integral with the press body 102. Also, the press body 102 may be formed to be integral with the covering body 100 without the intervention of the plurality of springs 103.

On the other hand, when the test is carried out on the bare chip 60, a pressing covering (not shown) of the carrier unit is held to the carrier housing 116 by the latch mechanism 116F thereof.

At a generally center of an upper portion of the covering body 100, a female thread section 100s is provided to be screwed with a male thread section in a load cell described later.

Figure 18A:
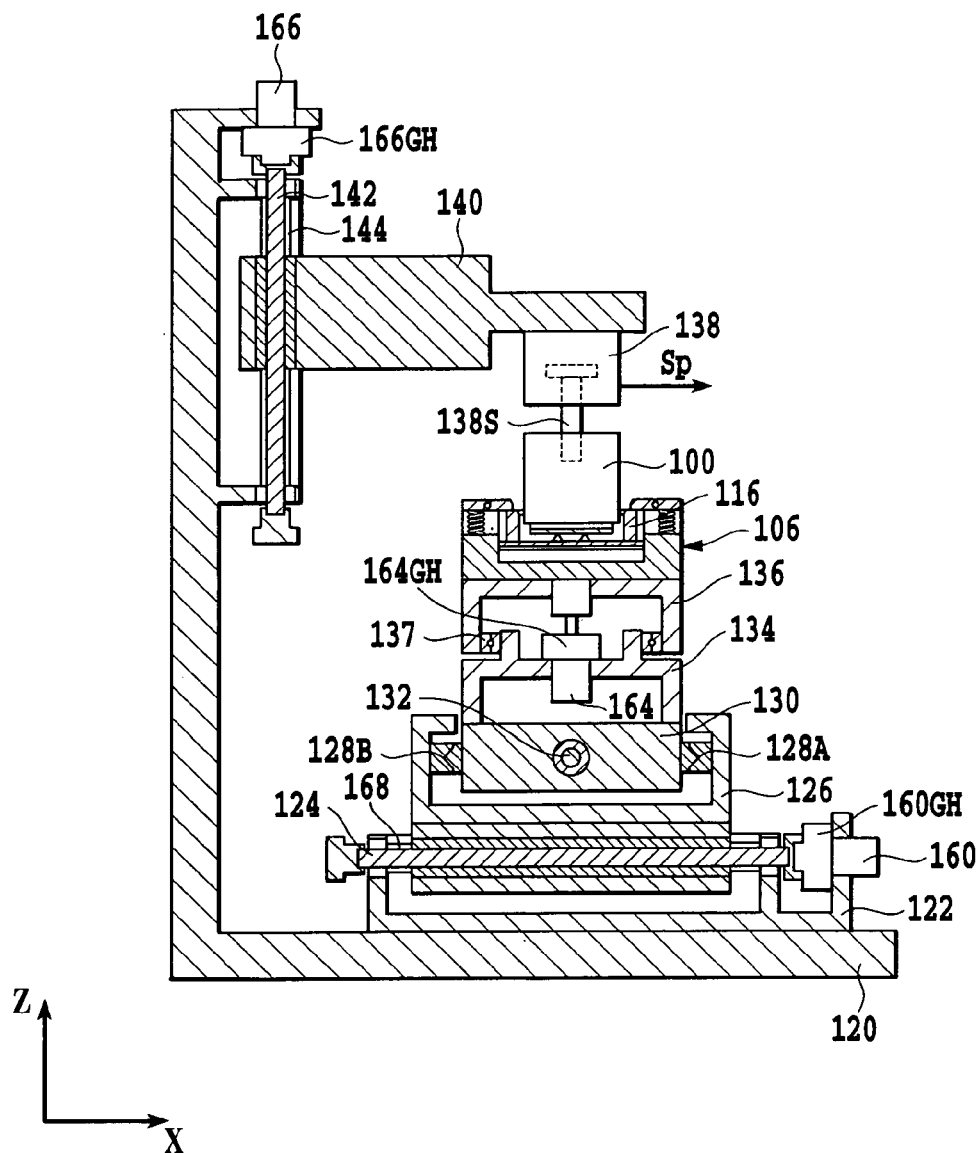
FIG. 18A, 18B is a block diagram illustrating the entire structure of a sliding device used in the third embodiment of a recovery processing method of an electrode according to the present invention.

FIG. 18A schematically illustrated the entirety of a sliding device for moving the contact sheet 44 relative to the transfer plate fixing head in the step of the recovery processing for the bumps 44B on the contact sheet 44 in the third embodiment of a recovery processing method of an electrode.

The sliding device includes a table mechanism disposed on the base member 120 for fixing the carrier unit stage 106 holding the carrier housing 116 in which the contact sheet 44 is accommodated and moving the carrier unit stage 106 in a predetermined direction, and a press mechanism for holding the transfer plate fixing head and applying a predetermined pressure onto the transfer plate 104 and the bumps 44B on the contact sheet 44.

The table mechanism has a base 122 disposed on the base member 120, an X-directional stage member 126, a Y-directional stage member 130 and a rotary stage 136. The X-directional stage member 126 is made to move by a ball screw member 124 supported on the base 122. The Y-directional stage member 130 is made to move by a ball screw member 132 supported by the X-directional stage member 126 in the direction generally vertical to the axial direction of the ball screw member 124. Further, the rotary stage 136 holds the carrier unit, while being supported for rotation by a stage supporting section 134 disposed on the Y-directional stage member 130.

The base 122 consists of a horizontal portion formed in the direction shown by an arrow X, and a vertical portion extended transverse to the horizontal portion in the direction shown by an arrow Z in FIG. 18A.

The X-directional stage member 126 is guided by a guide rail 168 and supported in a movable manner by a ball screw member 124 via a nut. Opposite ends of the ball screw member 124 are supported by the X-directional ends of the base 122 on the horizontal portion, respectively, in FIG. 18A. At one end of the ball screw member 124, an output shaft of a drive motor 160 fixed to the base 122 is coupled via a reduction mechanism 160GH such as a planetary gear train. The drive motor 160 may be a linear motor, a stepping motor, a servomotor or others, for example. The drive motor 160 and each of other motors described later are controlled by a control unit 150 described later.

The Y-directional stage member 130 is supported by a pair of guide rails 128A and 128B disposed opposite to each other on the inner periphery of the X-directional stage member 126 to be movable in the direction vertical to the paper surface. The Y-directional stage member 130 is supported in a movable manner by the ball screw member 132 via a nut. The opposite ends of the ball screw member 132 are supported by the opposite ends of the X-directional stage member 126, respectively, as seen in the direction vertical to the paper surface in FIG. 18A. At one end of the ball screw member 132, an output shaft of a drive motor 162 fixed to the X-directional stage member 126 is coupled via a reduction mechanism such as a planetary gear train. The drive motor 162 may be a linear motor, a stepping motor, a servomotor or others, for example.

At a center of a stage supporting section 134 fixed to the upper surface of the Y-directional stage member 130, a drive motor 164 is fixed. The stage supporting section 134 is fixed to the upper surface of the Y-directional stage member 130 via an opening of the X-directional stage member 126. An output shaft of the drive motor is coupled to the inside of a center hole of a disk portion in the rotary stage 136 via a reduction mechanism 164GH. A lateral wall of the rotary stage 136 is supported on the upper portion of the stage supporting section 134 via a bearing 137. The drive motor may be a linear motor, a stepping motor, a servomotor or others, for example.

Thereby, the rotary stage 136 is made to rotate about a central axis of the Y-directional stage member 130 and a central axis of the stage supporting section 134 when the drive motor 164 is in the operative state.

The carrier unit stage 106 is fixed to the disk portion of the rotary stage by fastening means not shown, such as screws.

The press mechanism includes a load cell 138 for detecting a pressure applied to the bump 44B via the transfer plate fixing head, a Z-directional stage member 140 for holding the load cell 138 and transmitting the pressure to the transfer plate fixing head, a ball screw member 142 fitted to the Z-directional stage member 140 to move the same, and a drive motor 166 for rotating the ball screw member 142.

Opposite ends of the ball screw member 142 are supported for rotation by a pair of brackets provided at a predetermined distance on the vertical portion. One end of the ball screw member 142 is coupled to an output shaft of a drive motor 166 fixed to the vertical portion via a reduction mechanism 166GH. The drive motor 166 may be a linear motor, a stepping motor, a servomotor or others, for example.

The Z-directional stage member 140 is fitted to the ball screw member 142 via a nut to be generally vertical to the axis thereof, and guided by a guide rail 144 while inhibiting the self-rotation.

Figure 18B:
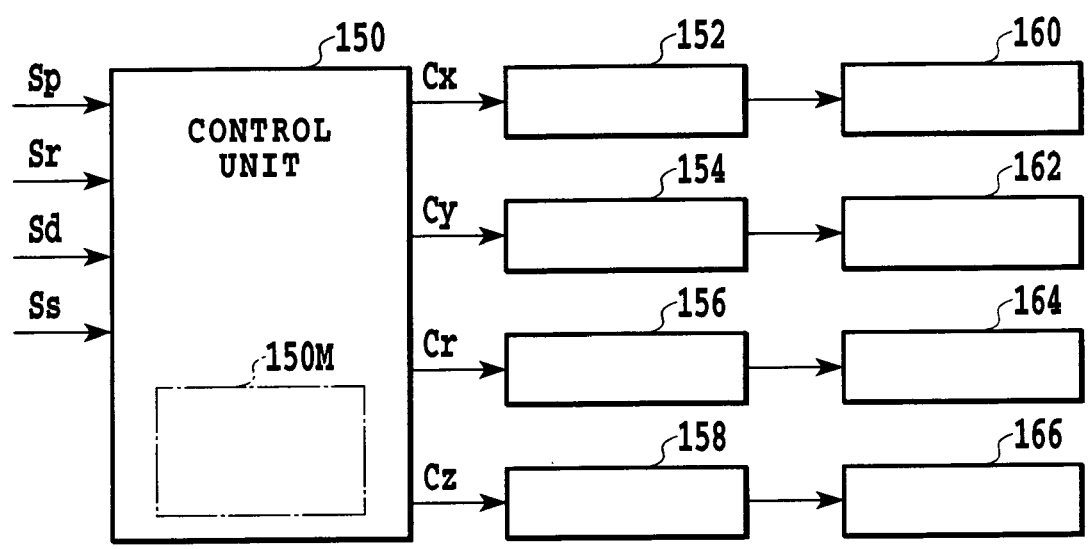

The load cell 138 is coupled to the covering body 100 by screwing the male thread section 138s coupled to an internal sensor part with the female thread section 100s of the transfer plate fixing head. The load cell 138 detects the pressure of the Z-directional stage member 140 applied to the transfer plate fixing head and issues a detection signal Sp representing the pressure to the control unit 150 as shown in FIG. 18B.

The following signals are fed to the control unit 150; a reset command signal Sr representing the command for returning the position of the respective stage member to a predetermined reference position, issued from a production-management host computer not shown, a moving-direction command signal Sd representing a direction in which the carrier housing 116 is to be moved, a recovery-treatment starting command signal Ss and the above-mentioned detection signal Sp from the load cell 138.

The control unit 150 is provided with a memory 150 in which are stored set values of the pressure applied to the transfer plate fixing head determined in accordance with the contact sheets 44, data representing displacements of the carrier housing 116 (carrier unit stage 106) or program data for carrying out the recovery treatment.

The pressure value is selected in accordance with sizes of the bump 44B, for example, in a range from 1 to 100 g per one electrode. In one example, a lower limit of the pressure value is in the range from 1 to 40 g.

The displacement of the carrier housing 116 (the carrier unit stage 106) in one direction is set by taking a play in the respective mechanism, a deflection of the contact sheet 44 or others into consideration so that the relative displacement of the bump 44B is within a range from 1 µm to 1 mm, for example. In one example, the lower limit of the relative displacement of the bump 44B is within a range from 1 µm to 100 µm.

Upon the recovery treatment of the third embodiment of a recovery processing method of an electrode according to the present invention, the carrier unit stage 106 on which is attached the carrier housing 116 carrying the contact sheet 44 having the worn bumps is first held in the disk portion of the rotary stage 136 disposed at the reference position.

Then, the control unit 150 determines the displacement of the respective stage member based on the recovery-treatment staring command signal Ss, the moving-direction command signal Sd and the data stored in the memory 150, so that the displacement of the carrier housing 116 and the carrier unit stage 106 becomes the predetermined value.

At that time, the control unit 150 determines the displacement of the Z-directional stage 140 based on the detection signal Sp and the data of the pressures stored in the memory 150.

The control unit 150 forms a pulse control signal Cz in accordance with the determined displacement and feeds the same to a motor drive circuit 158. The motor drive circuit 158 issues a drive signal based on the pulse control signal Cz.

Subsequently, the control unit 150 forms pulse control signals Cx, Cy and Cr at least once for displacing the carrier housing 116 and the carrier unit stage 106 and feeds them to motor drive circuits 152, 154 and 156, respectively. The motor drive circuits 152, 154 and 156 feed drive signals to the drive motors 160, 162 and 164 based on the pulse control signals Cx, Cy and Cr, respectively.

Thereby, the bump 44B of the contact sheet 44 in the carrier housing 116 is displaced once relative to the transfer plate 104 in the predetermined direction at the predetermined distance.

Thus, in the same manner as in the first embodiment as above, a relatively fine irregularity is formed at the worn end of the bump in correspondence to the pressing and sliding of the micro-irregularity on the transfer surface of the transfer plate 104 without applying relatively great pressing force. This surface roughness height is in the range from approximately 0.001 to 5 µm at approximately 0.1 to 50 µm intervals, for example. The range as a lower limit is at approximately 0.1 to 50 µm intervals, in the height range from approximately 0.002 to 3 µm, for example.

In this embodiment, since no heating is necessary contrary ton the first embodiment, the control of the slide distance is easy during the recovery treatment and the treatment is completed in a shorter period, which is suitable for the mass-production.

The control unit 150 forms the pulse control signal Cz for releasing the pressure and feeds the same to the motor drive circuit 158.

The carrier housing 116 in which the recovered contact sheet is accommodated is removed from the carrier unit stage 106. At that time, the control unit 150 forms the control signals Cx, Cy, Cr and Cz for returning the respective stage members to the reference positions based on the control signal Sr fed thereto, and feeds the same to the motor drive circuits 152, 154, 156 and 158, respectively.

The removed carrier housing 116 is mounted in the accommodation portion in the IC socket 30 as a carrier unit after the bare chip 60 and the pressing covering have been mounted, in the same manner as in the preceding embodiment.

Figure 20:
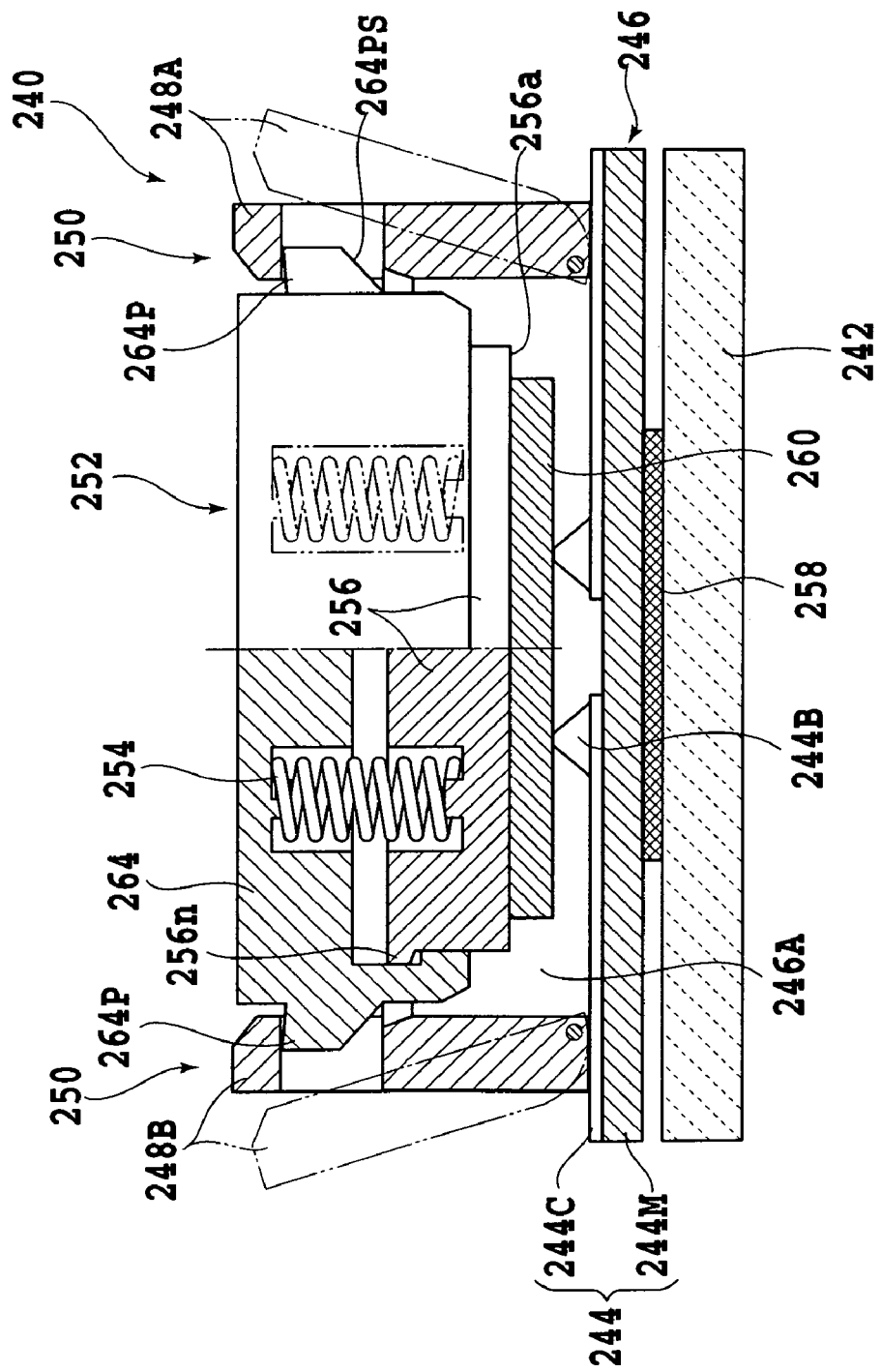
FIG. 20 is a sectional view illustrating a structure of a carrier unit to which is applied the fourth embodiment of a recovery processing method of an electrode according to the present invention.

FIG. 20 schematically illustrates a structure of a carrier unit provided with a connection electrode plate to which is applied the fourth embodiment of a recovery processing method of an electrode according to the present invention.

A carrier unit 240 not illustrated is detachably disposed, for example, in an accommodation portion of an IC socket as shown in the above-mentioned embodiments. Such an IC socket is used for a test for an electric characteristic of the semiconductor device, more specifically a burn-in test or others.

As shown in FIG. 20, the carrier unit 240 includes a carrier housing 246 having an accommodation portion 246A for accommodating a bare chip 260 as a semiconductor device, a contact sheet 244 disposed on a base member 242 forming the bottom of the accommodation portion 246A of the carrier housing 246 via an elastic sheet 258, a pressing covering 252 including a press body 256 for pressing a group of electrodes in the bare chip 260 to bumps 244B of the contact sheet 244, and a latch mechanism 250 selectively holding the pressing covering 252 on the carrier housing 246.

The pressing covering 252 includes the pressing body 256 having a pressing surface 256a to be in contact with the upper surface of the bare chip 260, a covering body 264 for accommodating a base portion of the pressing body 256, and a plurality of springs 254 disposed in a space between a recess in a base portion of the pressing body 256 and a relatively deep recess of the covering body 264, for biasing the pressing body 256 to the bare chip 260.

The bare chip 260 of a generally square shape has a predetermined group of electrodes, for example, on the lower surface thereof opposed to the group of bumps in the contact sheet 244.

A base portion of the pressing body 256 is movably inserted into a relatively shallow and wide recess in the covering body 264. At an end of the inserted portion of the pressing body 256, there are a plurality of nibs 256n to be engageable with nibs provided at a lower end of the covering body 264. Thereby, the pressing body 256 is held by the covering body 264 while being biased by the biasing force of the springs 254.

The covering body 264 has a lug 264p at each of opposite ends thereof to be engaged with a hook member 248A or 248B in the latch mechanism 250. The lugs 264p have slanted surfaces 264ps for pressing the hook members 248A and 248B to be away from each other by the engagement with the slanted surfaces at tip ends of the hook members 248A and 248B, when the pressing covering 252 is mounted.

The latch mechanism 250 comprises of the hook members 248A and 248B supported at the opposite ends of the carrier housing 246 in a rotatable manner, for holding the covering body 264, a helical torsion spring (not shown) for biasing each of the hook members 248A and 248B in the direction to engage the same with the lug 264p of the covering body 264, and a supporting shaft (not shown) for supporting the helical torsion spring.

A wall portion forming the accommodation portion 246A of the carrier housing 246 guides the outer circumference of a lower portion of the covering body 264 when the pressing covering 252 is mounted.

Figure 21:
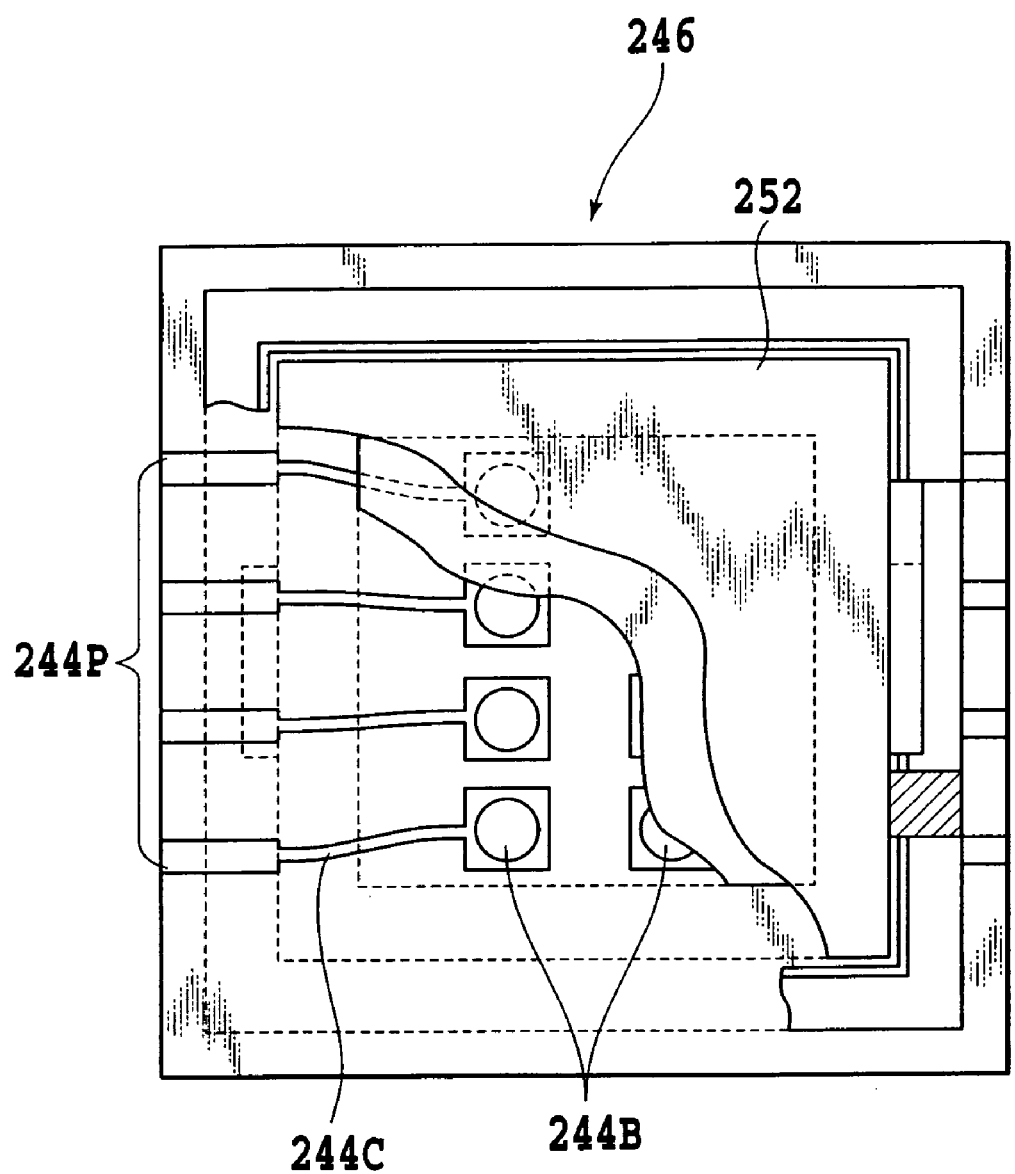
FIG. 21 is a plan view of the embodiment shown in FIG. 2.

As shown in FIGS. 20 and 21, the contact sheet 244 has a plurality of bumps 244B in a substrate 244M arranged in correspondence to the electrode group of the bare chip 260 to be electrically connected to the bumps.

Note that, in FIG. 21, of the plurality of bumps 244B, several of them are typically shown in an exaggerated manner.

The respective bump 244B is formed by plating a surface of copper which is a base material with nickel and gold. A tip end of the respective bump 244B is projected only a predetermined height from the surface of the substrate 244M. A diameter of a root portion of the respective bump 244B is about 60 μm, for example. A hardness of the respective bump 244B after annealing is e.g. in a range from 20 to 125 (Hv), preferably 48, 90 or 125 (Hv) in view of the durability. The substrate 244M is made, for example, of polyimide resin to be a sheet approximately 40 μm in thickness.

The reason why the hardness of the respective bump 244B is necessarily in a range from 20 to 125 (Hv) is based a result obtained from the diligent study of the present inventors described below:

An experiment has been carried out in such a manner that contact sheets having bumps, a hardness (after annealing) of which is 48, 90 and 125 (Hv), respectively, were prepared, and a pressure of 5 or 90 gf per one bump has been uniformly applied to tip ends of a plurality of bumps in the respective contact sheet, after which a diameter of the collapsed tip end of the bump is measured.

The respective contact sheet had 55 bumps arranged at a predetermined pitch in a matrix. The tip end of the bump prior to being collapsed has been formed by an arc having a radius of curvature of approximately 5.0 μm. Also, a diameter of a root portion of the bump has been approximately 60 μm.

Figure 31:
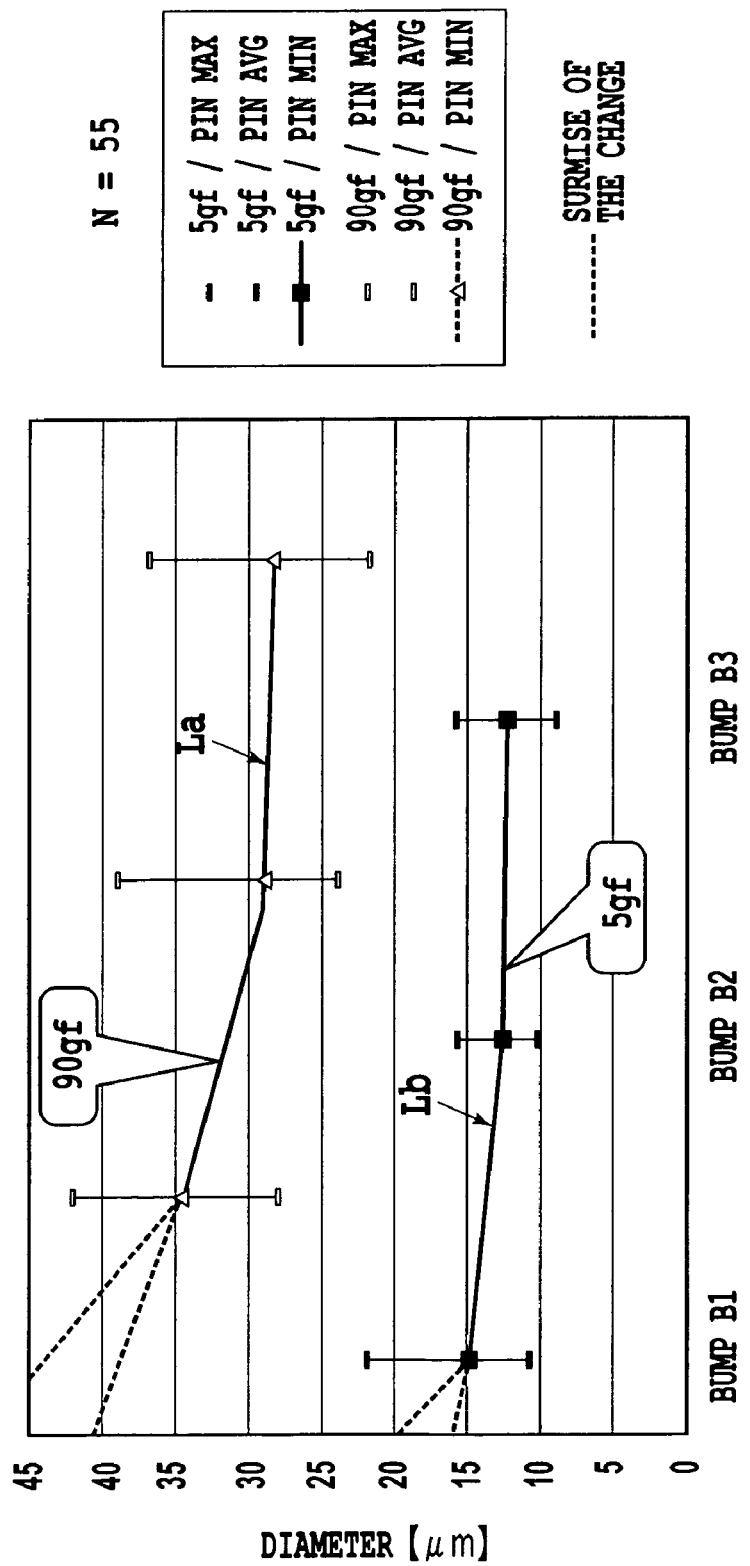
FIG. 31 is the characteristic plot illustrating the relationship between a diameter of a bump and a kind of the bump processed by one embodiment of a recovery processing method of an electrode according to the present invention.

FIG. 31 shows characteristic lines La and Lb representing the change in tip end diameter of the bump collapsed by the respective pressure, wherein an ordinate axis represents a tip end diameter of the collapsed bump and an abscissa axis represents kinds of bumps (B1, B2 and B3) having different hardness values. In this regard, the bumps B1, B2 and B3 had hardness values of 48, 90 and 125 (Hv), respectively.

The characteristic line La represents the collapsed tip end diameters of the respective bumps B1, B2 and B3 after a pressure of 90 gf has been applied thereto. On the other hand, the characteristic line Lb represents the collapsed tip end diameters of the respective bumps B1, B2 and B3 after a pressure of 5 gf has been applied thereto.

As apparent from the characteristic line La, in a case of the bump B1, the diameter thereof is in a range from approximately 27.5 to 42.5 μm and a mean value of the diameter (an average diameter of 55 bumps) is approximately 34 μm. In the bumps B2 and B3, the diameters thereof are in a range from approximately 24 to 39 μm and from approximately 22 to 37 μm, respectively. The mean values of the diameter are approximately 29 and 28 μm, respectively. This means that a large change has not seen in the diameter of the bumps B2 and B3.

As apparent from the characteristic line Lb, in a case of the bump B1, the diameter thereof is in a range from approximately 11 to 22 μm and a mean value of the diameter (an average diameter of 55 bumps) is approximately 14 μm. In the bumps B2 and B3, the diameters thereof are in a range from approximately 9 to 15 μm and from approximately 8.3 to 15 μm, respectively. The mean values of the diameter are approximately 12.5 and 12 μm, respectively. Accordingly, this means that a large change has not seen in the diameter of the bumps B2 and B3.

If the hardness of the bump exceeds 125 (Hv), an effect of absorbing the variance for the height of the plurality of bumps due to the collapse of the tip ends thereof is not expected, and there is a risk in that some bumps may not be brought into contact with the transfer surface of the transfer plate. Further, if the hardness of the bump is less than 20 (Hv), the change in diameter value is surmised as indicated by a broken line on the characteristic lines La and Lb in FIG. 31, which means that there is a risk of degradation of the durability and the deterioration of the bump. Based on the description mentioned above, the hardness of the bump is determined in a range from 20 to 125 (Hv).

The respective bump 244B is connected to a pad 244$p$ via a conductive layer 244$c$ formed of a copper foil as shown in FIG. 21. The pad 244$p$ is formed at each of opposite ends of the substrate 244M projected outward from the base member 242.

In a state in which the carrier unit 240 of the above-mentioned structure is mounted to the accommodation portion of the IC socket as described above, a test is carried out on the respective bare chip 60 in a predetermined atmosphere.

Upon such a test, the above-mentioned contact sheet 244 is repeatedly used for a predetermined number of fresh bare chips mounted thereon.

Figure 26A:
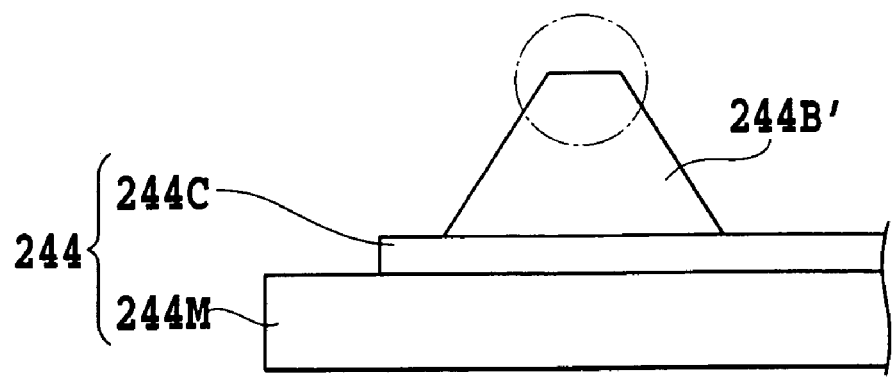
FIGS. 26A and 26B are a partially sectional view of a bump used in one embodiment of a recovery processing method of an electrode according to the present invention and an enlarged view of a tip end thereof, respectively.
Figure 26B:
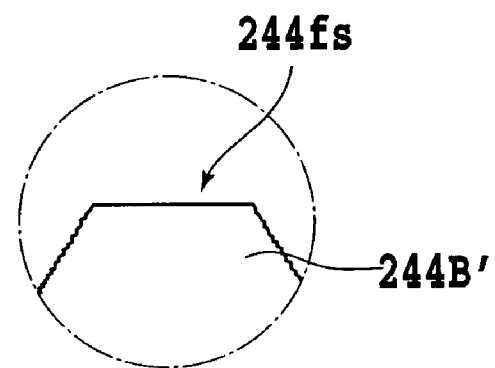

When a single contact sheet 244 is repeatedly used for the predetermined number of bare chips 260, the topmost end of the respective used bump 244B' is collapsed to be a generally truncated cone shape having a flat top surface as enlargedly shown in FIGS. 26A and 26B. Accordingly, such a flat top surface 244$fs$ of the respective bump 244B' has no micro-irregularity.

Hereunder, when the single contact sheet 244 is repeatedly used the predetermined number of times or more without changing the same, there might be a risk in that the mutual electric connection becomes unreliable between the contact sheet 244 and the bare chip 260.

Figure 27A:
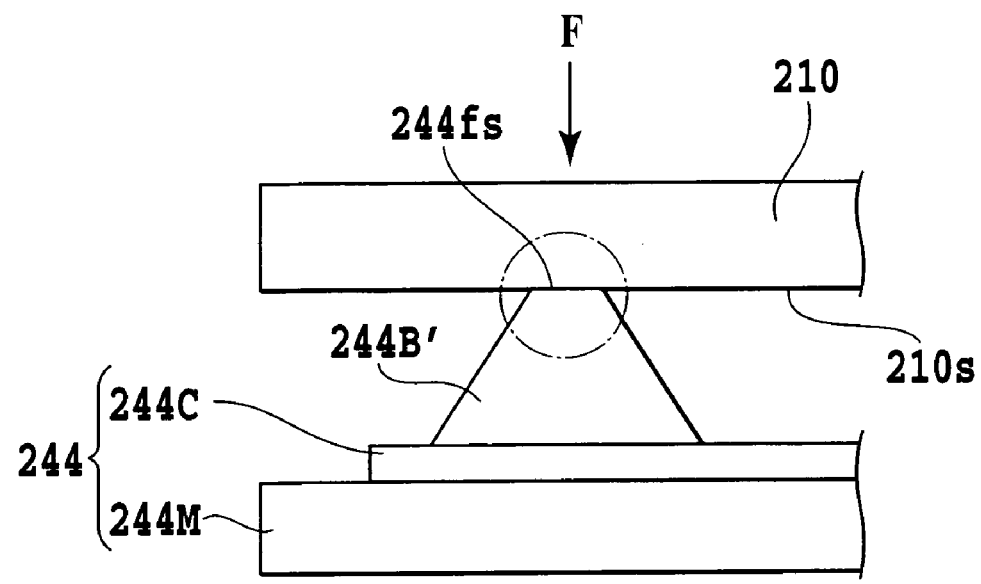
FIGS. 27A and 27B are partially sectional views made available for explaining a process in one embodiment of a recovery processing method of an electrode according to the present invention, respectively.

Accordingly, in one embodiment of the recovery processing method of an electrode according to the present invention, a transfer plate 210 having a predetermined thickness as shown in FIG. 27A is prepared in advance. This transfer plate 210 is formed, for example, of surface-treated alumina ceramics to be a generally square-shaped plate having a predetermined thickness, and at least one of transfer surfaces 210$s$ has the irregularity 210$a$ of a predetermined roughness, for example, an arithmetic mean deviation of the profile Ra in a range from 0.5 to 1.5 µm, preferably approximately 0.97 µm as shown in an enlarged manner in FIG. 27B. In this regard, the surface roughness of the irregularity 210$a$ is selected to have a maximum height of profile Rmax in a range from 0.5 to 12 µm or a ten-point height of irregularities Rz in a range from 0.5 to 8 µm (see Japanese Industrial Standards: JIS B0601-1982). The material of the transfer plate 210 should not be limited to this example but may be other metallic materials.

Then, as described later, the transfer surface 210$s$ is pressed onto the bumps 244B' of the contact sheet 244 at a predetermined pressure.

Figure 23:
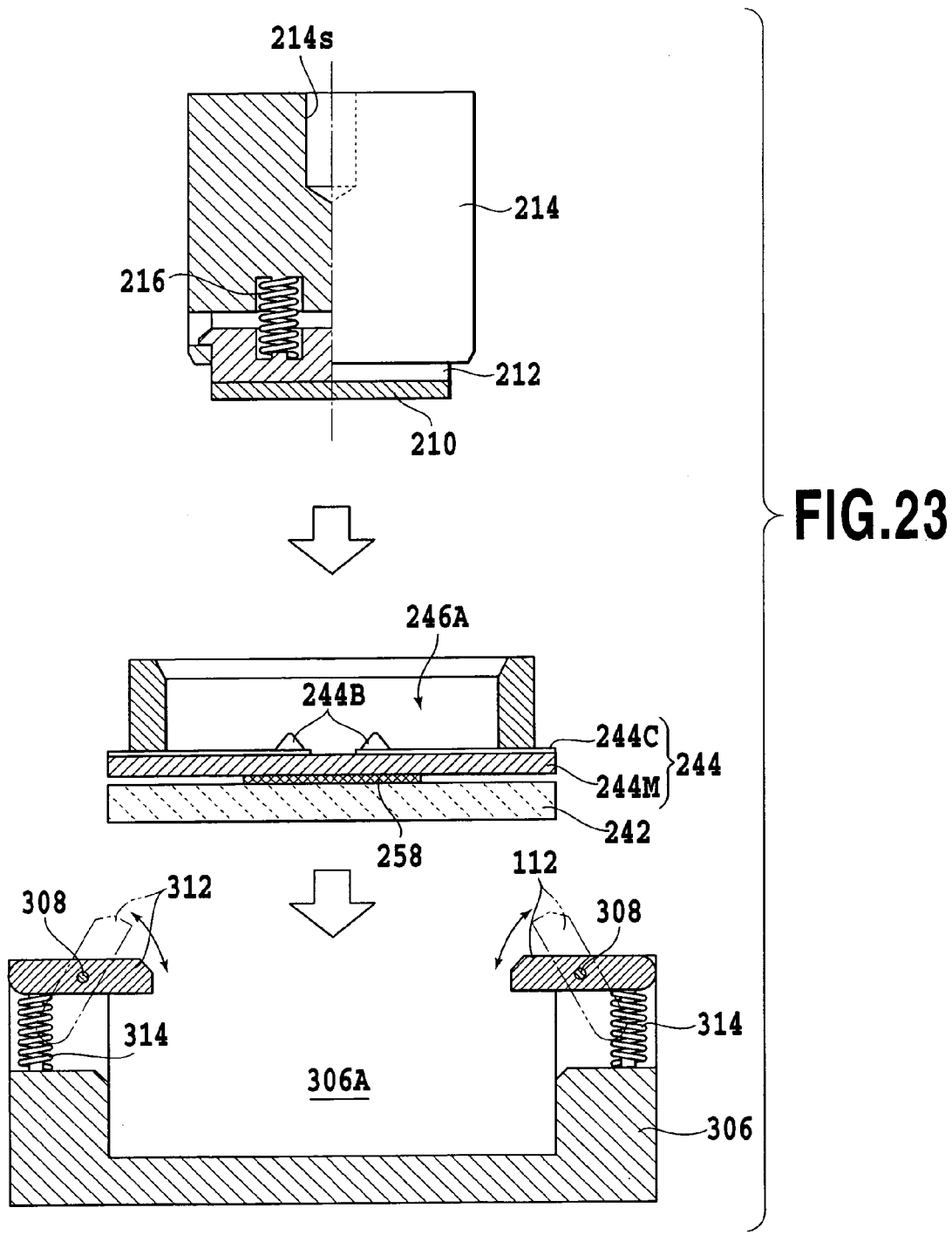
FIG. 23 is an exploded sectional view illustrating a structure of a carrier unit stage used in the pressing device shown in FIG. 22 together with a transfer plate fixing head.
Figure 24:
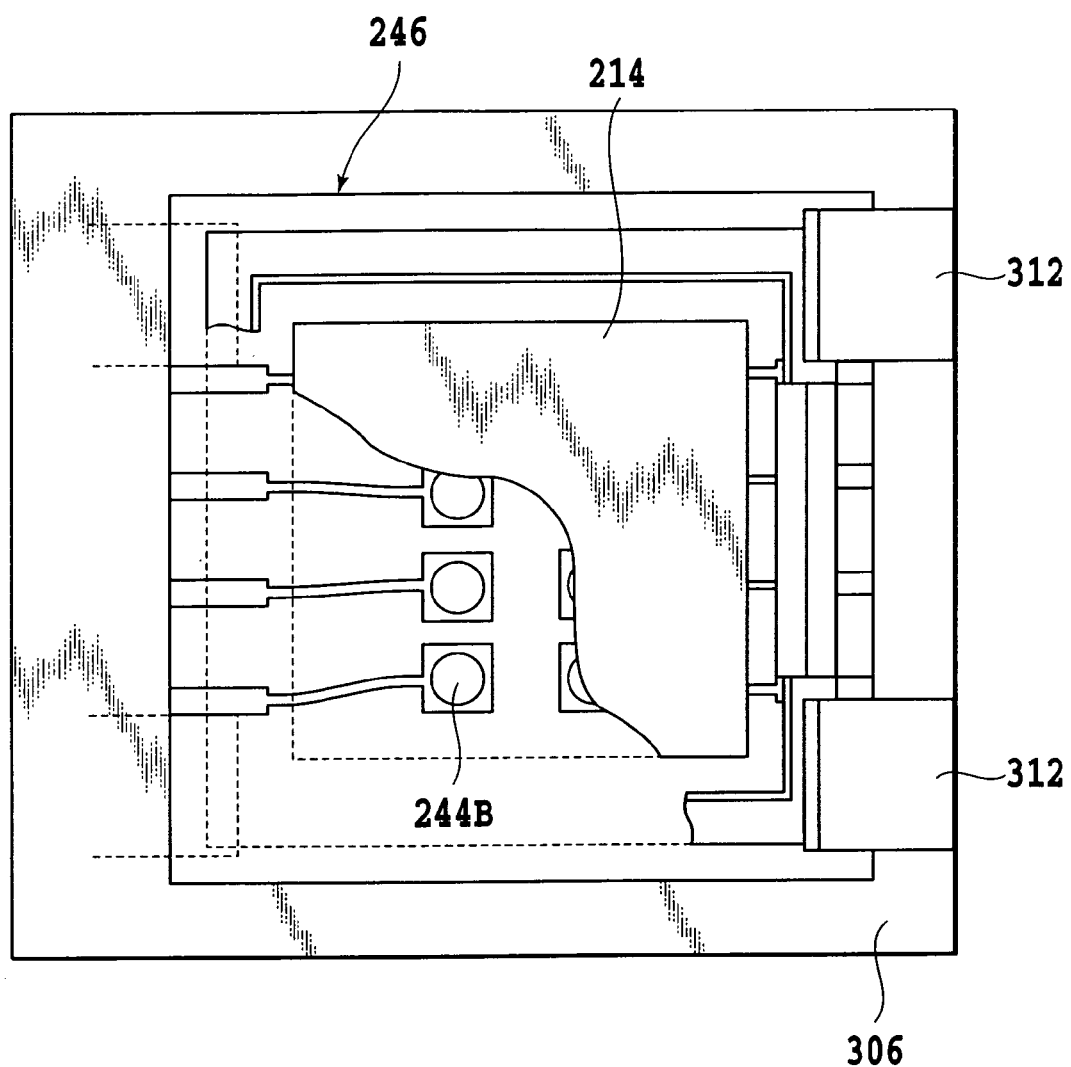
FIG. 24 is a plan view of the carrier unit stage shown in FIG. 23 while the transfer plate fixing head is mounted thereto.
Figure 25:
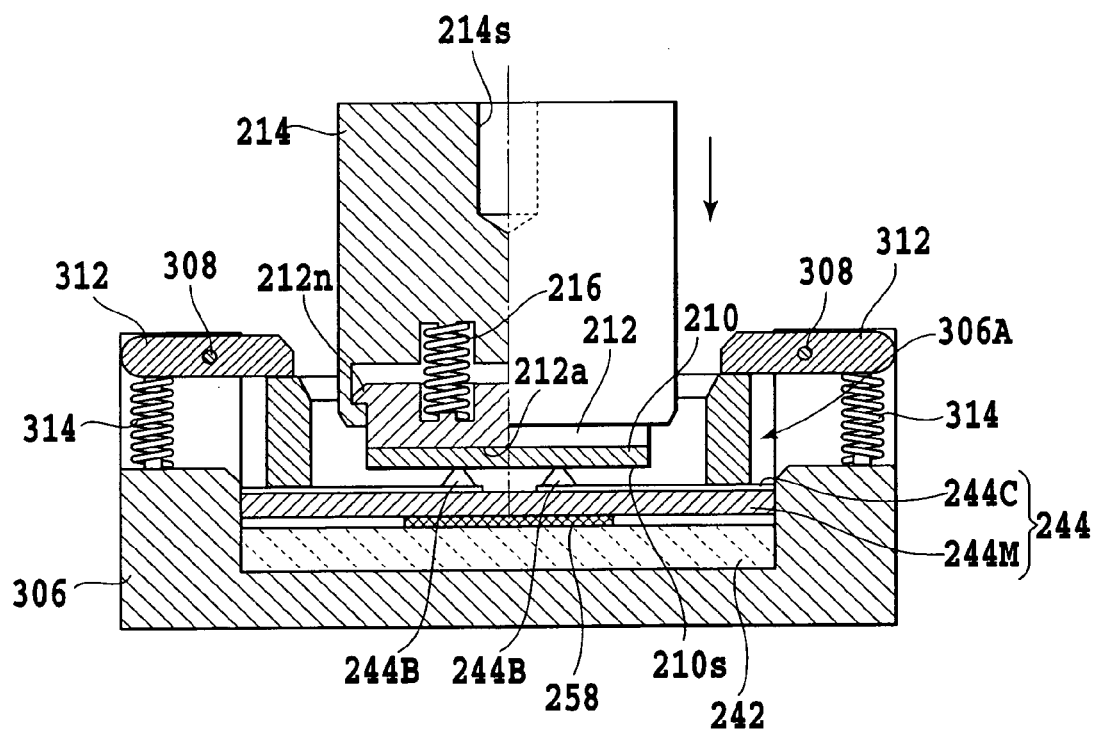
FIG. 25 is a sectional view of a structure of the carrier unit stage used in the pressing device shown in FIG. 22 together with the transfer plate fixing head.

Upon pressing the transfer plate 210, the transfer plate 210 is fixed to a fixing surface of a transfer plate fixing head described later, for example, as shown in FIGS. 23 and 25.

The transfer plate 210 fixed to the transfer plate fixing head is placed on a common plane formed of a plurality of flat surfaces 244$fs$ as shown in FIG. 27A so that the transfer surface 210$s$ thereof is brought into contact with the worn flat surface 244$fs$ of the respective bump 244B'. Accordingly, the transfer plate 210 is supported by the flat surfaces 244$fs$ of the plurality of bumps 244B'.

At that time, the transfer plate fixing head and the transfer plate 210 is pressed by a pressing device (see FIG. 22) described later at a predetermined pressure in the direction indicated by an arrow F in FIG. 27A, for example, for one second, and maintained in this contact state for one second. This press is repeated twice. In this regard, after the first press, the transfer plate 210 is once away from a tip end of the bump 244B.

The pressure is determined in a range from approximately 5 to 100 g per one bump 244B. Since the present inventor found by the experiment described later that if the pressure is less than approximately g per one bump 244B that it is difficult to uniformly press all of 55 bumps 244B, the pressure is determined at approximately 5 g per one bump 244B or more. In this regard, this pressure range is applied when the variance of the mutual distance between adjacent bumps 244B is less than 4 µm.

The above-mentioned experiment was carried out in such a manner that a conductor plate (silicon chip) on which an aluminum wiring network is formed is placed on at upper ends of a plurality of bumps 244B; for example, 55 bumps 244B; in stead of the transfer plate, and a contact resistance value between the respective bump 244B and the conductor plate was measured while changing a load applied to the bump 244B via the conductor plate. Accordingly, based on a result obtained from this experiment, a load value under which a generally whole surface of the conductor plate is uniformly in contact with all the bumps 244B is judged.

Figure 19:
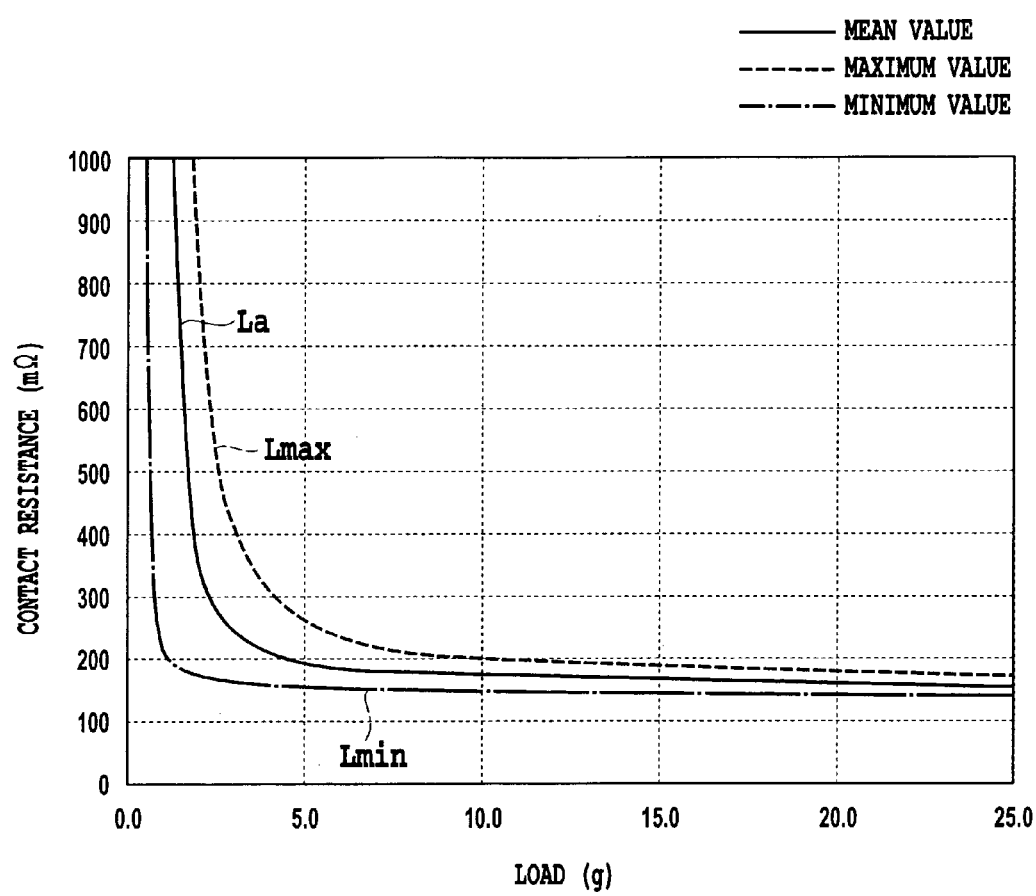
FIG. 19 is characteristic curves showing the relationship of the pressure and the contact resistance between the conductor plate and the electrode in a fourth embodiment of a recovery processing method of an electrode according to the present invention.

FIG. 19 shows characteristic curves representing a changing of a contact resistance value in accordance with a load obtained by the result of the above-mentioned experiment, wherein the coordinate axis represents a contact resistance value (mΩ) between the respective bump 244B and the predetermined conductor plate and an abscissa axis represents a pressing load (g).

The characteristic curve Lmax shows maximum values of the contact resistance under the respective given loads. The characteristic curve Lmin shows minimum values of the contact resistance under the respective given loads. The characteristic curve La shows means values of the contact resistance under the respective given loads.

As apparent from the characteristic curves Lmax, Lmin and La, the values of the contact resistance are not small and stable when the applied loads is smaller than 5 g per one bump 244B. On the contrary, if the applied loads exceed 5 g per one bump 244B, the values of the contact resistance are stabilized at a predetermined value. Accordingly, the pressing load applied to the transfer plate 210 is determined to be larger than 5 g per one bump 244B as described above.

On the other hand, as the pressing load becomes relatively large, there is a tendency in that a tip end diameter of the bump increases. In this regard, the tip end diameter of the bump must be equal to or smaller than a size of a pad of the semiconductor device to be electrically connected thereto (for example, approximately 100 µm).

Figure 32:
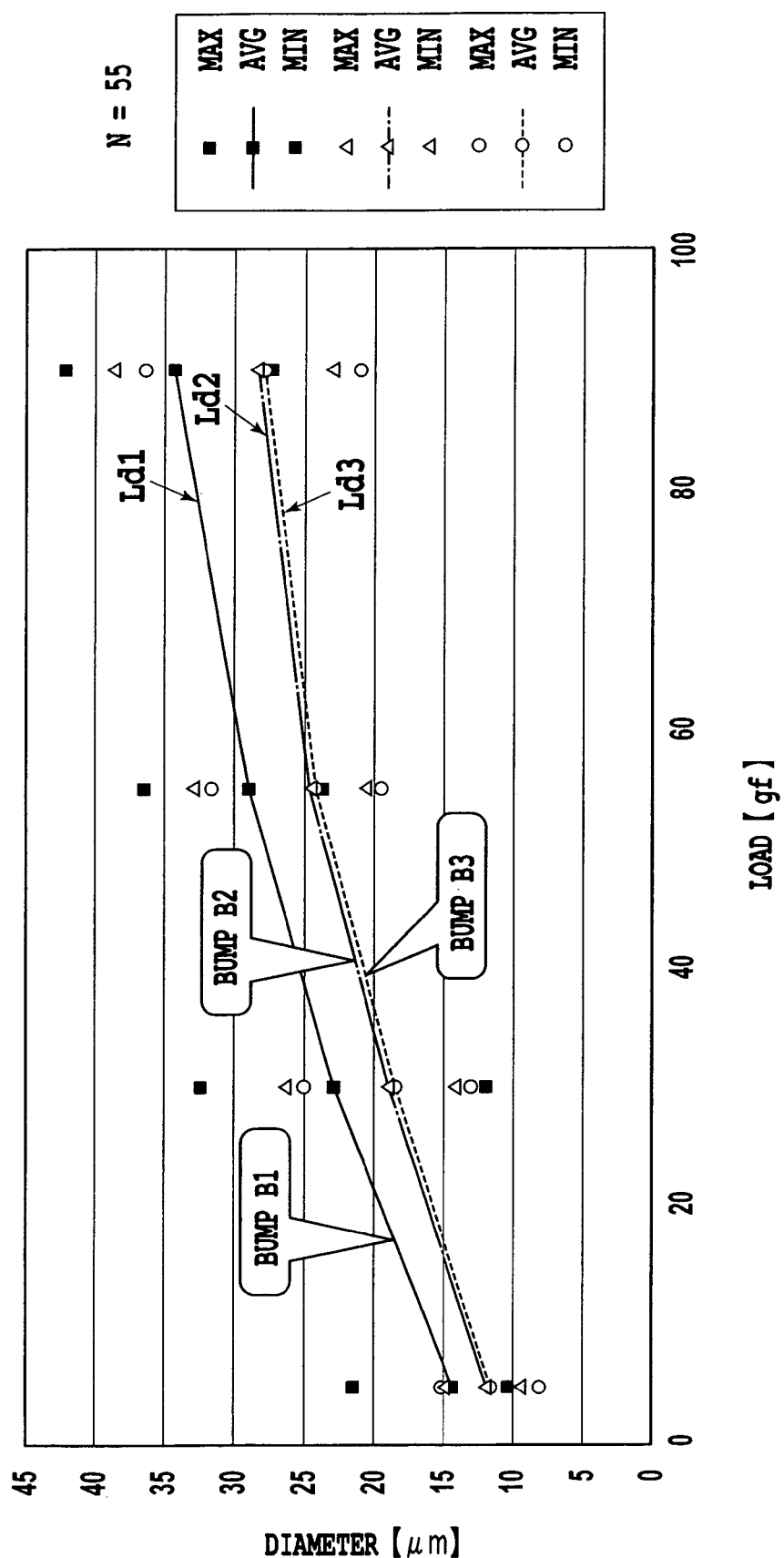
FIG. 32 is the characteristic plot illustrating the relationship between a diameter and a pressure load of a bump processed by one embodiment of a recovery processing method of an electrode according to the present invention.
Figure 33:
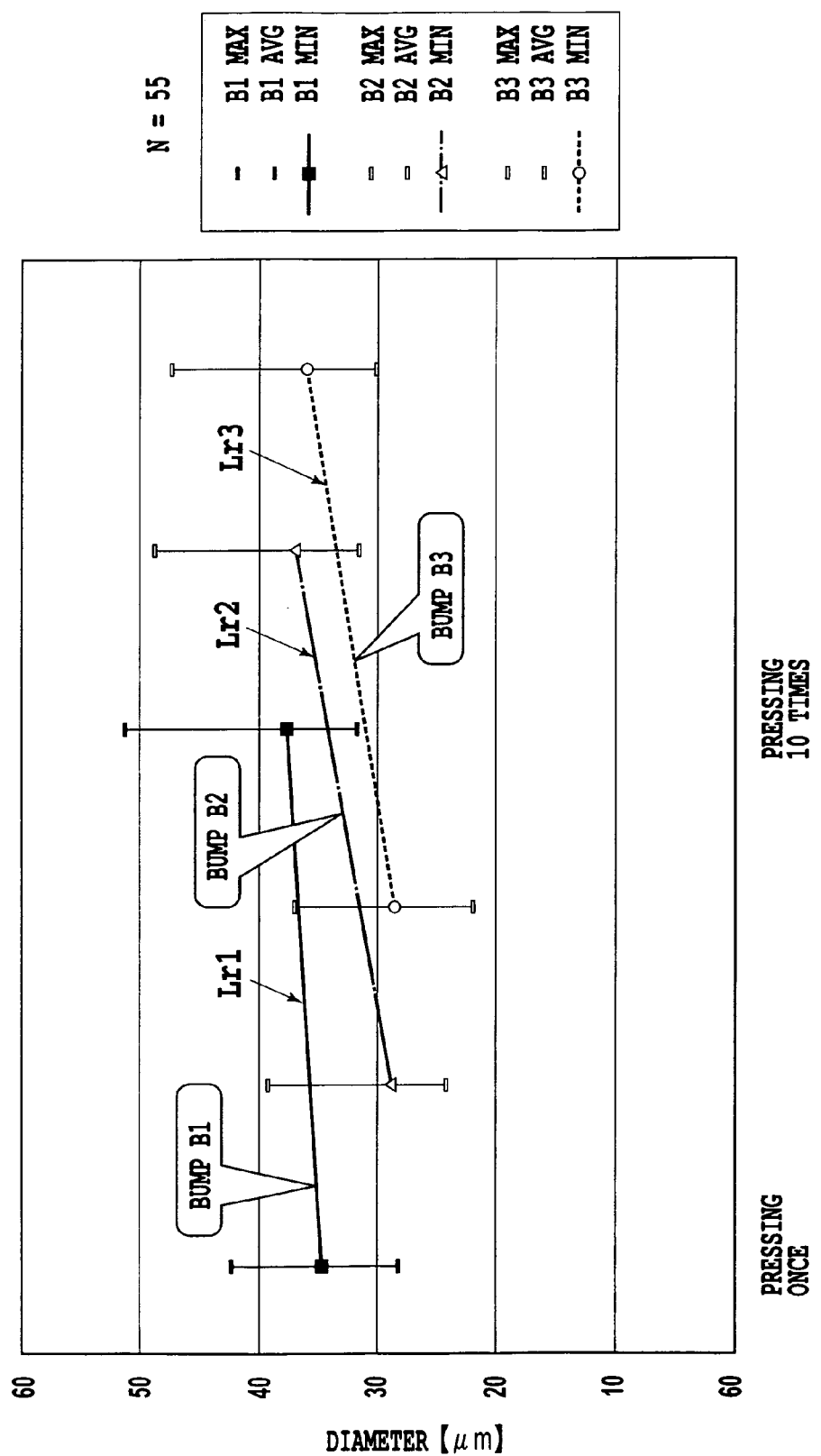
FIG. 33 is the characteristic plot illustrating the relationship between a diameter and the number of presses of a bump processed by one embodiment of a recovery processing method of an electrode according to the present invention.

The inventors of the present invention carried out a test to have the relationship between the pressing load and the collapsed tip end of the bump and obtained experimental results as shown in FIGS. 32 and 33.

FIG. 32 illustrates characteristic lines Ld1, Ld2 and Ld3 representing the change in tip end diameters of the above-mentioned bumps B1, B2 and B3 wherein a coordinate axis represents the tip end diameter of the bump after being pressed and an abscissa axis represents the pressing load/ bump. In this regard, the pressing load was uniformly applied to 55 bumps of the respective kind.

As apparent from the characteristic lines Ld1, Ld2 and Ld3, as the pressing load increases, the tip end diameter is liable to be larger. Also, when the hardness of the bump is relatively low (the characteristic line Ld1), the maximum diameter is approximately 42.5 μm at the pressing load of 90 g.

FIG. 33 illustrates characteristic lines Lr1, Lr2 and Lr3 representing the change in the tip end diameters of the bumps B1, B2 and B3 wherein a coordinate axis represents the tip end diameter of the bump after being pressed and an abscissa axis represents the repeated number of pressure (1 time and 10 times). The characteristic lines Lr1, Lr2 and Lr3 illustrate the change in the tip end diameter of the bump at the pressing load of 90 g/bump in accordance with the repeated numbers of pressure, respectively.

As apparent from the characteristic lines Lr1, Lr2 and Lr3, the tip end diameter of the bump is liable to be larger when the repeated number of pressure is ten than when it is once.

Particularly, when the hardness of the bump is relatively low (the characteristic line Lr1), the maximum tip end diameter of the bump is approximately 42 μm after being pressed once, and approximately 51 μm after being pressed ten times.

Accordingly, when the positional accuracy of the bump itself, the positional coincidence of the bump tip end with the pad and the tendency of the enlargement in the tip end diameter of the bump in accordance with the repeated number of pressure are taken into account, the pressing load is 100 g/bump or less as described before.

Figure 27B:
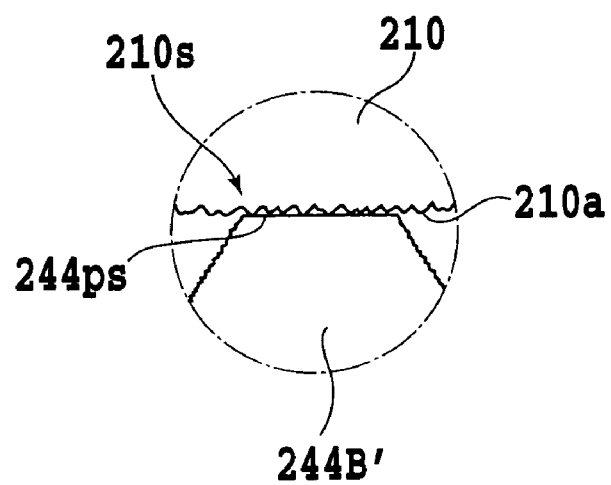

FIG. 27B illustrates a tip end of a bump 244B' directly after the transfer surface 210s is brought into contact with the flat surface 244fs and is pressed in an enlarged manner. As apparent from FIG. 28B, the tip end of the bump 244B' is pressed by the irregularity 210a of the transfer plate 210 whereby a relatively rough irregularity 244ps is formed at the tip end of the bump 244B'.

In FIG. 25, the above-mentioned transfer plate fixing head includes a pressing body 212 having a fixing surface 212a on which a surface opposite to the transfer surface 210s of the transfer plate 210 is fixed, a fixing head body 214 having a recess for accommodating a base of the pressing body 212, and a plurality of springs 216 disposed in the respective spaces between the recess of the base of the pressing body 212 and a relatively deep recess of the fixing head body 214, for biasing the transfer plate 210 toward the bumps 244B of the contact sheet 244. In this regard, FIG. 25 illustrates a state wherein part of the constituent elements of the carrier unit 240 from which the pressing covering is removed are held in a carrier unit stage described later.

The base of the pressing body 212 is inserted in a relatively shallow and wide recess of the fixing head body 214 in a movable manner. At an end of the portion in which the pressing body 212 is inserted, there are plurality of nibs 212n engaged with nibs provided at a lower end of the fixing head body 214 opposite thereto. Thereby, the pressing body 212 is held on the fixing head body 212 while being biased by the plurality of springs 216.

One surface of the transfer plate 210 is fixed to the above-mentioned fixing surface 212a with adhesive or a fastener. In this regard, the transfer plate 210 may be formed integral with the pressing body 212. Also, the pressing body 212 may formed, for example, integral with the fixing head body 214 without the intervention of the plurality of springs 216. Generally at a center of an upper portion of the fixing head body 214, there is a female thread portion 214s screw-engaged with a male thread portion of a load cell.

On the other hand, a pressing covering (not shown) of the carrier unit 240 is held on the carrier housing 246 by the latch mechanism 250 (see FIG. 20) when the bare chip 260 is tested.

As shown in FIGS. 23 and 25, a carrier unit stage 306 has an accommodation portion 306A for temporarily accommodating the carrier housing 246 during the recovery processing method of the bumps 244B in the contact sheet 244. An inner circumference of the accommodation portion 306A opening upward is formed to be enagageable with an end portion of the base member 242 for restricting the relative position of the base member 242 to the accommodation portion 306A.

On the peripheral edge of the accommodation portion 306A, a pair of latch mechanisms are opposed to each other for detachably holding the carrier housing 246 of the carrier unit 240. The respective latch mechanism includes a hook member 312 supported to be rotatable on a wall portion forming the accommodation portion 306A in the carrier unit stage 306 by a supporting shaft 308, for holding an upper end a wall portion forming the accommodation portion 246A of the carrier housing 246, and a coil spring 314 for biasing one end of the hook member 312 to be engaged with an upper end of the wall portion in the accommodation portion 246A.

When the carrier housing 246 of the carrier unit 240 is solely mounted to the interior of the accommodation portion 306A or removed therefrom, the hook member 312 rotates so that one end thereof is away from the interior of the accommodation portion 306A against the biasing force of the coil spring 314, as indicated in FIG. 23 by a two-dot chain line. On the other hand, the one end of the hook member 312 is brought into contact with the upper end of the wall portion of the accommodation portion 246A of the carrier housing 246 due to the biasing force of the coil spring 314 when the carrier housing 316 is held in the interior of the accommodation portion 306A.

The above-mentioned transfer plate fixing head is disposed in the interior of the accommodation portion 246A of the carrier housing 246 in the carrier unit 240 disposed in the carrier unit stage 306 as shown in FIG. 25 when the recovery processing method is carried out on the contact sheet 244 of which bumps have been worn.

Figure 22:
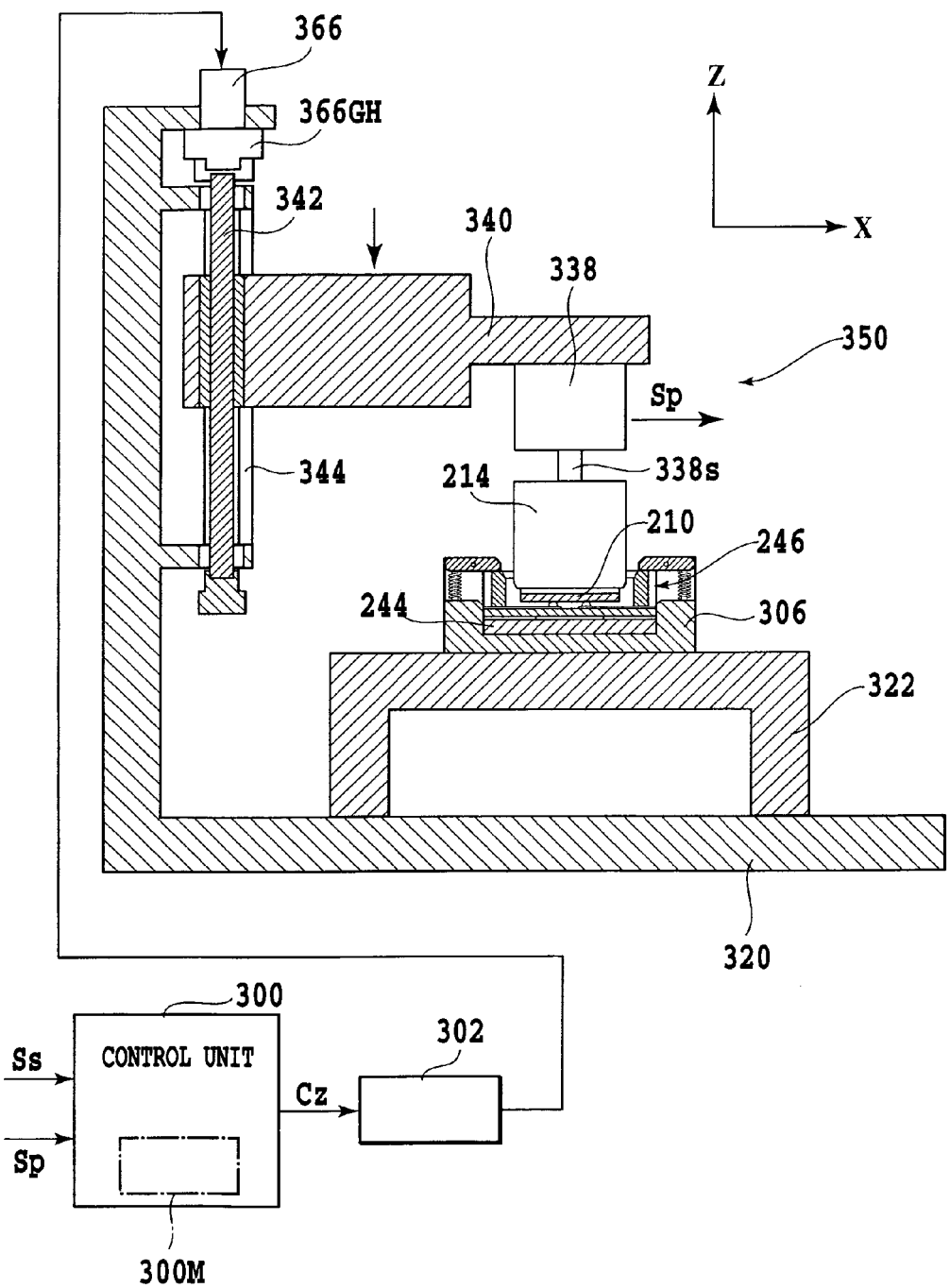
FIG. 22 is a structural drawing schematically illustrating a total structure of a pressing device used in the fourth embodiment of the present invention.

FIG. 22 schematically illustrates a whole structure of a pressing device used for a pressing process in the above-mentioned recovery processing method.

A pressing device 350 includes a stand 322 disposed on the base member 320, for fixing the carrier unit stage 306 for holding the carrier housing 246 in which the contact sheet 244 is accommodated, and a pressing mechanism for holding the transfer plate fixing head and applying a predetermined pressure to the bumps 244B of the contact sheet 244 via the transfer plate 210.

The base member 320 includes a flat portion formed in the direction indicated by an arrow X in FIG. 22 for supporting the stand 322, and a standing-up surface portion extending in the direction shown by an arrow Z generally vertical to the flat portion. The carrier unit stage 306 is fixed to the flat portion of the stand 322 by fastener members not shown such as screws or others.

The pressing mechanism includes a load cell 338 for detecting the pressure applied to the bumps 244B via the transfer plate fixing head, a Z-axial stage member 340 for holding the load cell 338 and transmitting the pressure to the transfer plate fixing head, a ball screw member 342 engaged with the Z-axial stage member 340 and supporting the latter in a movable manner, and a drive motor 366 for rotating the ball screw member 342.

Opposite ends of the ball screw member 342 are supported by a pair of brackets provided in the standing-up surface portion at a predetermined distance in a rotatable manner. One end of the ball screw member 342 is coupled to an output shaft of the drive motor 366 fixed to the standing-up surface portion via a reduction mechanism 366GH. The drive motor 366 may be a linear motor, a stepping motor, a servo motor or others.

The z-axial stage member 340 is engaged with the ball screw member 342 via a nut so that the latter is generally vertical to an axis of the former, and is guided by a guide rail 344 without rotating on its axis.

The load cell 338 is coupled to the fixing head body 214 by screw-engaging a male thread portion 338s thereof coupled to a sensor portion in the interior of the cell with a female thread portion 214s of the transfer plate fixing head. The load cell 338 detects a pressure of the z-axial stage member 340 to the transfer plate fixing head and transmits a detection signal Sp representing the pressure to a control unit 300.

The control unit 300 is supplied with a recovery processing initiation signal Ss from a host computer for the production control not shown and the detection signal Sp from the above-mentioned load cell 338.

Also, the control unit 300 is provided in the interior thereof with a memory 300M for storing predetermined values of the pressure to be applied to the transfer plate fixing head in accordance with the contact sheets 244, program data for executing a series of a recovery processing method or others.

The pressure values are determined in accordance with sizes of the bump 244B to be in a range, for example, from approximately 5 to 100 g per one electrode (bump) as described above.

According to one embodiment of the inventive recovery processing method of an electrode, first, the carrier unit stage 306 to which is attached the carrier housing 246 accommodating the contact sheet 244 having worn bumps is held on the flat surface of the stand 322 as shown in FIG. 22.

Next, the control unit 300 sets the pressure based on the recovery processing initiation signal Ss and data in the memory 300M.

At that time, the control unit 300 sets an amount of displacement corresponding to the pressure based on the detection signal Ss and data of the predetermined values of the pressure stored in the memory 300M.

First, the control unit 300 makes a pulse control signal Cz in accordance with the amount of displacement thus determined and supplied the same to a motor drive circuit 302 to carry out the first pressing of the transfer plate 210. The motor drive circuit 302 issues a drive signal to the drive motor 366 based on the pulse control signal Cz so that the pressing is maintained, for example, for one second after the pressing has continued for one second.

Next, the control unit 300 makes a new pulse control signal Cz and issues the same to the motor drive circuit 302 to once release the pressure and separate the transfer plate 210 from the bumps 244B.

Then, the control unit 300 makes a further pulse signal Cz in accordance with the set amount of displacement and issues the same to the motor drive circuit 302 to carry out a second pressing of the transfer plate 210. The motor drive circuit 302 supplies a drive signal based on the pulse control signal Cz to the drive motor 366 so that the pressing is maintained, for example, for one second after the pressing has continued for one second.

Thereby, the second pressing process for the transfer plate 210 has completed, and thus the recovery processing method for the bumps 244B of the contact sheet is finished.

The carrier housing 246 accommodating the recovered contact sheet is removed from the carrier unit stage 306.

The removed carrier housing 246 is mounted to the accommodation portion of the IC socket after the bare chip 260 and the pressing covering have been mounted as a carrier unit.

Figure 28A:
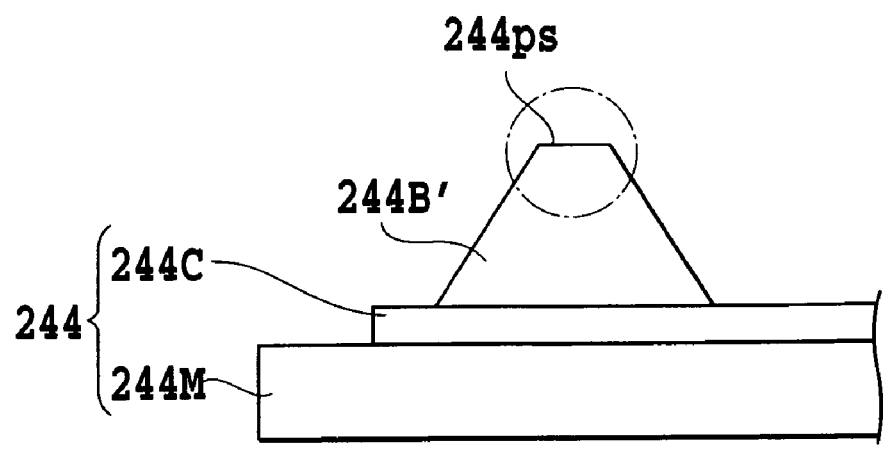
FIGS. 28A and 28B are partially sectional views made available for explaining a process in one embodiment of a recovery processing method of an electrode according to the present invention, respectively.
Figure 28B:
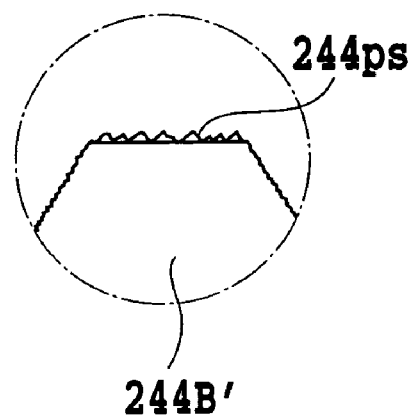

Accordingly, as shown in FIG. 28B, relatively small irregularity in correspondence to the pressing of the micro-irregularity 210a of the transfer surface 210s in the transfer plate 210 is formed at worn ends of the respective bumps 244B'.

According to an experiment by the inventors of the present invention, when the above-mentioned bump B3 is once pressed under the pressing load of 5 g/bump, a gap between adjacent peaks or valleys in the irregularity of the bump 244B' is approximately 2.60 μm and a depth of the irregularity is approximately 1.120 μm. Alternatively, according to another experiment by the inventors of the present invention, when the above-mentioned bump B1 is pressed 10 times by the pressing load of 90 g/bump, a gap between adjacent peaks or valleys in the irregularity of the bump is approximately 1.30 μm and a depth of the irregularity is approximately 1.0 μm.

That is, according to this embodiment, a series of the recovery processing method can be easily controlled and carried out in a relatively short period, and as a result, this embodiment is suitable for the mass-productivity. In addition, there is no risk of flying undesirable chips of the connecting surface in the electrode.

In this regard, while the pressing by the transfer plate 210 is repeated twice in the above-mentioned embodiment, it is not limited thereto but may be only once if the pressure increases in accordance with the hardness of the bump.

Figure 29:
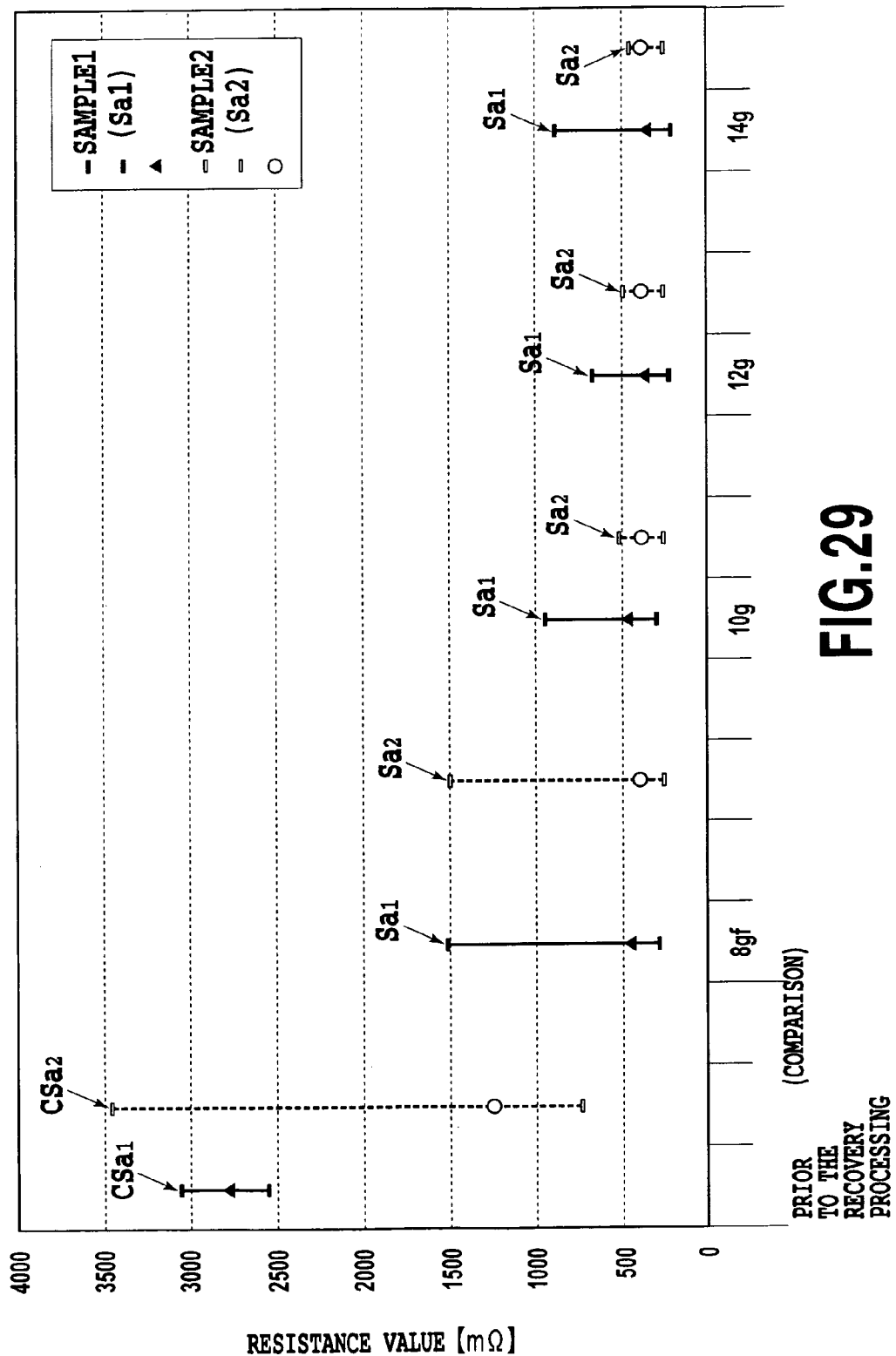
FIG. 29 is the characteristic plot illustrating the comparison of an electric characteristic of a bump processed by one embodiment of a recovery processing method of an electrode according to the present invention with that of a bump processed by a comparative example.

FIG. 29 is a characteristic graph showing the difference in electric characteristic between contact sheets Sa1 and Sa2 having the bumps 244B' subjected to the above-mentioned recovery processing method and contact sheets Csa1 and Csa2 not subjected to the recovery processing method as comparative examples.

In FIG. 29, a resistance value between adjacent two bumps in a contact sheet connected via a predetermined conductor plate is measured at the connecting end while a predetermined current is supplied, and plotted on a coordinate system wherein a coordinate axis represents the resistance value (mΩ) and an abscissa axis represents the load (g) applied to the transfer plate used for the recovery processing method. The respective resistance value was measured by a resistance meter (4338A MILLIOHM METER provided by HEWLETT PACKARD Co.).

In this experiment, a transfer plate made of alumina ceramic which transfer surface 210s has a surface roughness (an arithmetic mean deviation of the profile) Ra of 0.97 μm is used. The contact sheets Sa1 and Sa2 subjected to the same recovery processing method have the same bump structure and material each other. A hardness of the bump in the respective contact sheets Sa1 and Sa2 is 48 (Hv). Also, the comparative contact sheets Csa1 and Csa2 have the same bump structure and material which are the same as those of the above-mentioned contact sheets Sa1 and Sa2.

As apparent from the characteristic graph shown in FIG. 29, when the load applied to the transfer plate is 8, 10, 12 and 14 g, respectively, the resistance value in the contact sheet Sa1 which has been subjected to the recovery processing method is in a range from 294.0 to 1509 (mΩ), from 310 to 942 (mΩ), from 227 to 667 (mΩ) and from 209 to 872 (mΩ), respectively. Also, the resistance value in the contact sheet Sa2 which has been subjected to the recovery processing method is in a range from 216 to 1492 (mΩ), from 226 to 515 (mΩ), from 247 to 505 (mΩ) and from 238 to 412 (mΩ), respectively.

On the other hand, in the comparative contact sheets CSa1 and CSa2 not subjected to the recovery processing method, the resistance value is in a range from 2554 to 3065 (mΩ) and from 735 to 3449 (mΩ), respectively.

Thus, since the resistance value of the contact sheets Sa1 and Sa2 subjected to the recovery processing method is considerably smaller than the maximum value of the comparative contact sheets CSa1 and CSa2 as apparent from the result shown in FIG. 29, it has been proved that the electric connection is assuredly achievable by the bumps in the contact sheets Sa1 and Sa2 subjected to the recovery processing method.

Figure 30:
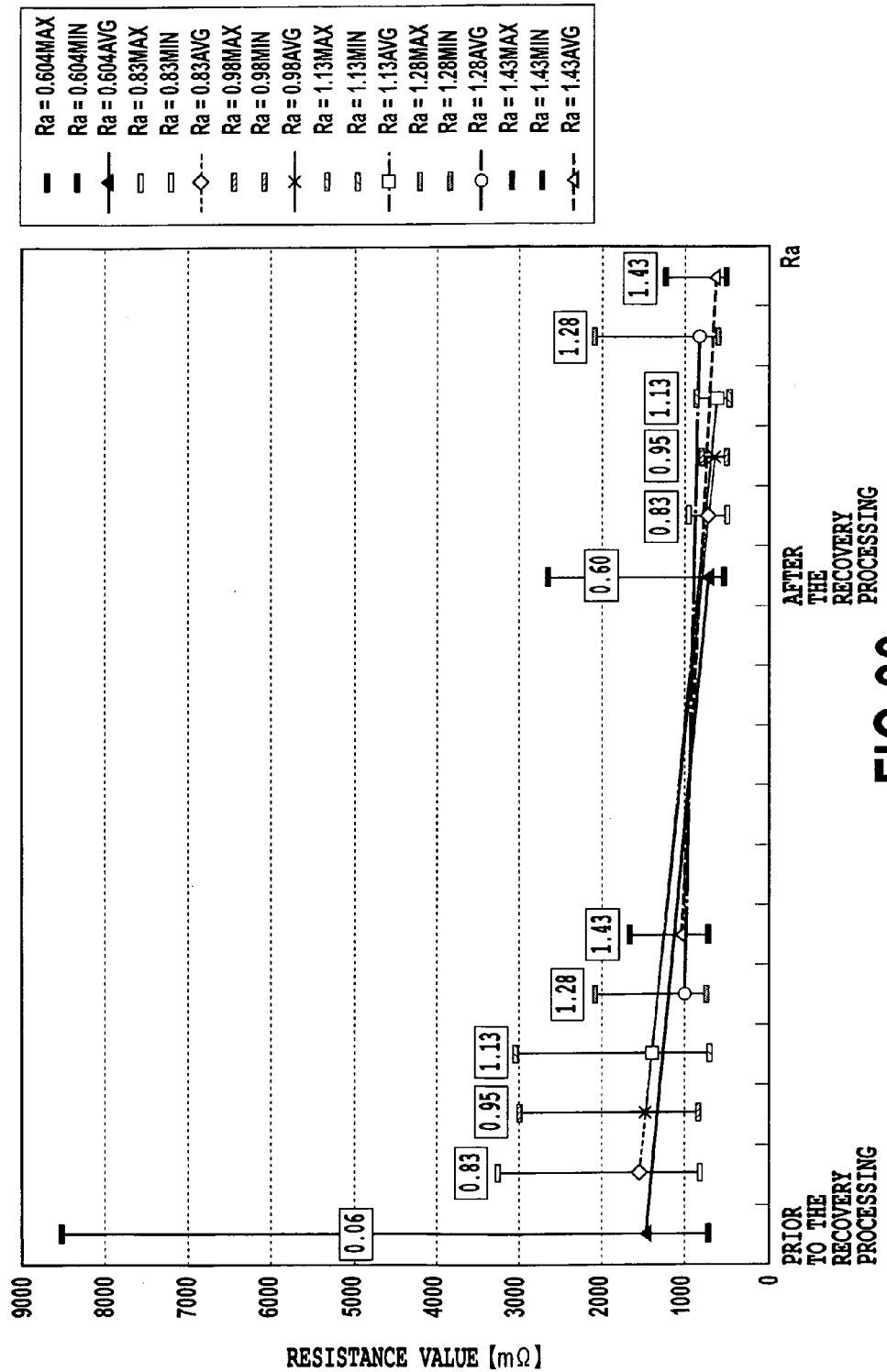
FIG. 30 is the characteristic plot illustrating the relationship between an electric characteristic of a bump processed by one embodiment of a recovery processing method of an electrode according to the present invention and a surface roughness of the transfer surface of a transfer plate.

In FIG. 30, resistance values between adjacent two bumps in the contact sheets prior to and after the recovery processing method, connected via a predetermined conductor plate are measured at the connecting end while a predetermined current is supplied, and plotted on a coordinate system wherein a coordinate axis represents the resistance value (mΩ) and an abscissa axis represents the arithmetic mean deviation of the profile (Ra) in the transfer surface of the transfer plate. The respective resistance value was measured by a resistance meter (4338A MILLIOHM METER provided by HEWLETT PACKARD Co.).

The results shown in FIG. 30 have been obtained by the experiment conducted by the inventors of the present invention. In this experiment, the resistance values were measured after the pressing operation is repeated twice at a predetermined pressure, for example, of 18 g to the bumps on each of six contact sheets by the transfer plates having the transfer surfaces of the arithmetic mean deviation of the profile of 0.60, 0.83, 0.95, 1.13, 1.28 and 1.43, respectively.

As shown in FIG. 30, if the recovery processing method is carried out by the transfer plate having the transfer surface of the arithmetic mean deviation of the profile of 0.60, the resistance value is in a range from 502 to 2650 (mΩ).

On the other hand, if the recovery processing method is not carried out, the resistance value is in a range from 680 to 8525 (mΩ).

When the recovery processing method is carried out by the transfer plate having the transfer surface of the arithmetic mean deviation of the profile of 1.43, the resistance value of the contact sheet is in a range from 625 to 1219 (mΩ). On the other hand, if the recovery processing method is not carried out, the resistance value of the contact sheet is in a range from 683 to 1650 (mΩ).

As apparent from the result of the experiment shown in FIG. 30, when the recovery processing method is carried out by the transfer plate having the transfer surface of the arithmetic mean deviation of the profile Ra in a range from approximately 0.60 to 1.43, the resistance values become smaller in comparison with when the recovery processing method is not carried out. That is, the contact sheet subjected to the recovery processing method results in the better electric connection in comparison with the contact sheet not subjected to the recovery processing method.

The present invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A recovery processing method of an electrode comprising:
a first step of placing a transfer plate having an irregular transfer surface satisfying an arithmetic mean deviation of a profile Ra in a range from 0.5 to 1.5 μm or less onto a connection surface of an electrode section formed on an insulation substrate for the electric connection to a terminal section of a semiconductor device via said connection surface of said electrode section, so that said transfer surface of said transfer plate is brought into contact with said connection surface,
a second step of pressing said transfer plate placed on said connection surface of said electrode section in said first step toward said connection surface of said electrode section at a predetermined pressure, and
a third step of separating said transfer plate from said electrode plate after said transfer plate has been pressed in said second step to form a predetermined irregularity on said connection surface of said electrode section.

2. A recovery processing method of an electrode as claimed in claim 1, wherein in said second step, said transfer plate is pressed toward said connection surface of said electrode section in a range from 5(g) to 100 (g) per one electrode section.

3. A recovery processing method of an electrode as claimed in claim 1, wherein a hardness of said electrode section is in a range from 20 to 125 (Hv).

* * * * *